US008897184B2

(12) United States Patent
Pettus et al.

(10) Patent No.: US 8,897,184 B2
(45) Date of Patent: Nov. 25, 2014

(54) SYSTEM AND METHOD FOR WIRELESS COMMUNICATION IN A BACKPLANE FABRIC ARCHITECTURE

(75) Inventors: Michael Gregory Pettus, Laguna Niguel, CA (US); James Robert Amos Bardeen, Los Angeles, CA (US)

(73) Assignee: Vubiq Networks, Inc., Irvine, CA (US)

( * ) Notice: Subject to any disclaimer, the term of this patent is extended or adjusted under 35 U.S.C. 154(b) by 0 days.

(21) Appl. No.: 13/561,993

(22) Filed: Jul. 30, 2012

(65) Prior Publication Data
US 2013/0107853 A1  May 2, 2013

Related U.S. Application Data

(63) Continuation-in-part of application No. 13/084,964, filed on Apr. 12, 2011, now Pat. No. 8,422,414, and a continuation of application No. 12/214,985, filed on Jun. 23, 2008, now Pat. No. 7,929,474.

(60) Provisional application No. 60/936,951, filed on Jun. 22, 2007, provisional application No. 61/513,434, filed on Jul. 29, 2011.

(51) Int. Cl.
| | | |
|---|---|---|
| *H04W 84/10* | (2009.01) | |
| *H04B 7/00* | (2006.01) | |
| *H04W 4/00* | (2009.01) | |
| *G06F 13/38* | (2006.01) | |
| *G06F 13/40* | (2006.01) | |
| *H01L 23/66* | (2006.01) | |
| *H01L 25/16* | (2006.01) | |
| *H04W 40/06* | (2009.01) | |

(52) U.S. Cl.
CPC ............. *H04W 84/10* (2013.01); *H04W 4/008* (2013.01); *G06F 13/385* (2013.01); *G06F 13/409* (2013.01); *H01L 23/66* (2013.01); *H01L 25/162* (2013.01); *H01L 25/165* (2013.01); *G06F 2213/3814* (2013.01); *H01L 2223/6677* (2013.01); *H04W 40/06* (2013.01); *H01L 25/16* (2013.01)

USPC ........................................ 370/310; 455/41.2

(58) Field of Classification Search
CPC ..... H04W 84/10; H04W 84/12; H04W 4/008; H01L 2223/6677
See application file for complete search history.

(56) References Cited

U.S. PATENT DOCUMENTS

| | | |
|---|---|---|
| 5,754,948 A | 5/1998 | Metze |
| 7,373,107 B1 | 5/2008 | Wesolowski |

(Continued)

FOREIGN PATENT DOCUMENTS

WO    2006102749 A1    10/2006

OTHER PUBLICATIONS

Lee, Jeong Su, Korean Intellectual Property Office, "PCT International Search Report and Written Opinion of the International Searching Authority," mailed Dec. 14, 2012.

(Continued)

*Primary Examiner* — Min Jung
(74) *Attorney, Agent, or Firm* — LeClairRyan, a Professional Corporation

(57) ABSTRACT

A system and method of wirelessly communicating in a backplane mesh network is disclosed. A data message received from a first network device is handled at a first antenna system located in a first network device cabinet via a first network interface. The data message is wirelessly transmitted from a first millimeter wave antenna coupled to the first antenna system over a high speed backplane network to a second network device in a second device cabinet using emitted millimeter wave electromagnetic radiation. The data message is wirelessly received at a second millimeter wave antenna over the high speed backplane network using emitted millimeter wave electromagnetic radiation, wherein the received data message is handled by a second antenna system coupled to the second millimeter wave antenna. The received data message is sent, via a second network interface, from the second antenna system to the second network device.

20 Claims, 12 Drawing Sheets

(56) References Cited

U.S. PATENT DOCUMENTS

| | | |
|---|---|---|
| 2006/0234787 A1 | 10/2006 | Lee et al. |
| 2006/0273973 A1* | 12/2006 | Chandler ............... 343/757 |
| 2008/0218413 A1 | 9/2008 | Li et al. |
| 2011/0199972 A1* | 8/2011 | Warke et al. ............ 370/328 |
| 2012/0002973 A1* | 1/2012 | Bruzzi et al. ........... 398/116 |
| 2012/0182094 A1* | 7/2012 | Kawamura ............. 333/239 |

OTHER PUBLICATIONS

Halperin, Daniel et al., "Augmenting Data Center Networks with Multi-Gigabit Wireless Links", Microsoft Research and University of Washington, SIGCOMM '11, Aug. 15-19, 2011 Toronto, Canada, pp. 38-49.

Katayama, Yasunao et al., "Wireless Data Center Networking with Steered-Beam mmWave Links", IBM Research—Tokyo, IEEE WCNC 2011—Service and Application, pp. 2179-2184.

Shin, Ji-Yong, et al., "On the Feasibility of Completely Wireless Datacenters", ANCS '12, Oct. 29-30, 2012 Austin, TX, ACM 978:1-4503-1685—Sep. 12, 2010.

Zhang, Weile, et al., 3D Beamforming for Wireless Data Centers, Hotnets '11, Nov. 14-15, 2011, Cambridge, MA, ACM 978-1-4503-1059 Aug. 11, 2011.

\* cited by examiner

SYSTEM AND METHOD FOR WIRELESS COMMUNICATION IN A BACKPLANE FABRIC ARCHITECTURE

RELATED APPLICATIONS

The present application is a continuation-in-part of co-pending U.S. patent application Ser. No. 13/084,964, filed Apr. 12, 2011, which is a continuation of U.S. patent application Ser. No. 12/214,985, filed Jun. 23, 2008, which claims priority to U.S. Provisional Patent Application Ser. No. 60/936,951, filed Jun. 22, 2007.

The present application also claims priority to U.S. Provisional Patent Application Ser. No. 61/513,434, filed on Jul. 29, 2011. The contents of U.S. Provisional Patent Application Ser. No. 61/513,434 are hereby incorporated by reference in their entirety.

FIELD

The present disclosure relates generally to a system and method for wireless communication in a backplane fabric mesh network architecture.

BACKGROUND

In enterprise computer and networking systems, it is often advantageous to utilize high-density computer processing, data storage and telecommunication hardware components for the processing, storage, switching, routing and transport of high speed data in the form of digital signals. It is also advantageous for a plurality of these various components to communicate with each other at very high speed signaling rates. The use of a component-based system having separation of functions such as processing, storage, switching, and input/output interfaces allows individual components to be updated or upgraded independently from other components as well as allows customization for specific tasks. Furthermore, the use of components is cost effective since developing or purchasing a new component is less expensive than developing or purchasing an entirely new integrated hardware system that is not based on component design. However, such existing systems are hardwired and use a central switching architecture to allow components to communicate with one another.

Furthermore, the modern data center is suffering from the constraints of cabled, fixed-lane architectures. The concept of interconnecting racks of computing/storage servers through switching equipment with high-speed cables/fibers is taken for granted as the only method for providing connectivity. The fundamental technique used to provide random server-to-server communications is dominated by the Ethernet switch, and in modern data centers the switching architecture is typically implemented through a tiered tree design. A typical equipment rack contains 20 to 40 servers that connect with Ethernet cables to the top-of-rack (TOR) switch. The TOR switches are then interconnected to the next tier in the switching system to an end-of-rack (EOR) switch (also known as a cluster switch). The EOR switch is normally a 10 gigabit Ethernet (10 GigE) switch with 100's of ports. The EOR/cluster switches are then interconnected with 10 GigE (heading towards 40 GigE in the near future) uplinks to the next tier. A diagram of this type of system often resembles a tree, and the interconnecting technologies are referred to as fat trees indicating higher-bandwidth interconnections near the "root" in an attempt to provide maximal non-blocking connectivity. The tree architecture requires that the switching be connected through several layers or stages in order to implement the required connectivity. Intra-rack connections are usually 1 GigE to the TOR switch, and the uplink connections are 10 GigE to the cluster switch, although higher speed connections are anticipated in the future heading towards 40 GigE and 100 GigE rates.

The implied switching architecture for the tree, or any system that uses fixed cabling for interconnection, is that all data must traverse a common or central switching system. Like the traditional central office with circuit switching that is centralized, the tree also has central elements at the higher tiers in the structure. This is simply a necessary fact for physically connected (cabled) systems. Like a highway with fixed on and off ramps, a car must use the lanes and ramps to get from point A to point B—there is no facility for randomly traversing two locations other than the infrastructure of dedicated lanes and ramps. The fixed cabling in the data center is its own constraint—the industry has built these centers based on this architectural assumption.

The efficiency of the networking architecture for a data center is affected by switch bandwidth, power, area required (including the impact of cabling infrastructure), and total system capacity. The current switching topologies are constrained by the maximum data communications bit rate that can be carried over cable or fiber as well as the practical limit on the number of switch input and output ports. Given these constraints, the switching architectures have evolved from the full non-blocking matrix to tree structures. By creating a tree with tiered levels, the maximum number ports per switch element can be limited to allow implementation using commodity switching integrated circuits.

As the size of the data center grows upwards towards 100,000 servers, the number of tiers in the switching topology in turn must grow in order to control footprint and costs. An example of a proposed switching architecture for a large data center may include a middle tier (ingress/egress switches or aggregation level) and two upper tiers of the topology having a total of 216 10-gigabit (10 GigE) switches, each with 144 ports, in addition to 5184 Top Of Rack (TOR) switches designed to support a total of 103,680 servers. Below the middle tier are the racks containing the servers. Implied in this design are 20 servers per rack. Each rack contains a TOR switch with twenty (20) 1 GigE ports for the servers and two (2) 10 GigE uplink ports for connectivity to the next tier. The upper tier (intermediate node/core switches) carries the highest bandwidth traffic. Since the bandwidth at the root is higher than the leaves (at the servers), the tree is designated as a fat tree.

In this example, the power required for each 10 GigE switch is approximately 15 kW, totaling to over 3 MW for the middle and upper tiers. The number of 10 GigE uplink cables from the TOR switches is 5184×2=10,368. The number of cables between the second and third tier is also 10,368, totaling to 20,736 10 GigE cables for the system. The full bisection bandwidth of this proposed fat tree topology is 103.68 Tb/s. Switching latency for a multi-tiered topology is incurred by traversing each stage of the switched path. In this example data leaves the source TOR switch and must move up through the second and third tiers and then back down to the destination TOR switch, accumulating 3 stages of switch latency plus the propagation delay in the cables. Assuming fiber cabling for all the 10 GigE connections, and using the fastest known 10 GigE switching equipment, the total (layer-1 only) latency comes out to a minimum of 2 μs.

Other approaches have proposed the reduction of switch equipment costs of a fat tree using only 1 GigE switches in order to leverage the lower costs of commodity level GigE products. In this example, the fat tree is implemented using 2880 commodity 48-port GigE switches providing 27.648 Tb/s of bisection bandwidth (hosting 27,638 servers). However, the savings in switch equipment costs would be obscured by the massive cabling required to interconnect the switches. It is estimated that that over 200,000 meters of cable would be required weighing nearly 10,000 kg or 22,000 pounds. This level of cabling complexity would significantly impact the design and cost of the proposed data center infrastructure.

What is needed is a system and method for high speed signaling in a backplane fabric that is not limited by fixed physical media and/or a centralized switching architecture.

SUMMARY

In an aspect, a backplane network comprises a first antenna system located in a first network device cabinet including at least one first network device configured to transmit a data message over a high speed backplane. The first antenna system includes a first millimeter wave antenna of the first antenna system located external to the first device cabinet and configured to communicate with the first network device. The first millimeter wave antenna is configured to wirelessly transmit the data message from the first network device over the high speed backplane using emitted millimeter wave electromagnetic radiation. The network includes a second antenna system located in a second network device cabinet including at least one second network device, wherein the first and second device cabinets are positioned spatially apart from one another. The second antenna system includes a second millimeter wave antenna of the antenna system coupled to the second antenna system and located external to the second device cabinet. The second millimeter wave antenna is configured to wirelessly receive the data message over the high speed backplane using millimeter wave electromagnetic radiation emitted from the second millimeter wave antenna, wherein the received data message is handled by the second network device, the entire communication being handled without a central switch.

In an aspect, a method of wirelessly communicating in a backplane mesh network is disclosed. The method comprises handling, at a first antenna system located in a first network device cabinet, a data message received from a first network device of the first network device cabinet via a first network interface. The method comprises wirelessly transmitting the data message from a first millimeter wave antenna that is coupled to the first antenna system, the first millimeter wave antenna configured to wirelessly transmit the data message over a high speed backplane network to a second network device in a second device cabinet using emitted millimeter wave electromagnetic radiation. The method comprises wirelessly receiving the data message at a second millimeter wave antenna of the second device cabinet. The second millimeter wave antenna is configured to wirelessly receive the data message over the high speed backplane network using emitted millimeter wave electromagnetic radiation, wherein the received data message is handled by a second antenna system that is coupled to the second millimeter wave antenna. The method comprises sending, via a second network interface, the received data message from the second antenna system to the second network device.

In one or more of the above aspects, the first millimeter wave antenna further comprises a first antenna pedestal that includes a base; and at least one removable or non-removable antenna housing coupled to the base, the at least one antenna housing having one or more waveguide antennas therein. The waveguide antennas further comprise a flange shaped antenna having an antenna aperture facing a distal end of the antenna housing; a communication device; and a launch transducer coupled to the communication device, wherein the launch transducer emits millimeter wave electromagnetic energy configured to propagate out the antenna aperture as millimeter wave radiation.

In one or more of the above aspects, the antenna housing includes a plurality of waveguide antennas. At least one of the waveguide antennas is configured to transmit data via a launch transmitter transducer and/or at least one of the waveguide antennas is configured to receive data via a launch receiver transducer.

In one or more of the above aspects, the first antenna system further comprises a processor configured to operate an executable data handler stored in a memory, wherein the processor, when executing the executable data handler, causes the processor to select a transmission path for the data message to the second antenna system. In an aspect, the transmission path further comprises at least one intermediate antenna system.

In one or more of the above aspects, the first and second antenna systems communicate using time division multiplexing access and frequency division multiplexing access.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

DESCRIPTION OF EXAMPLE EMBODIMENTS

Figure 1:
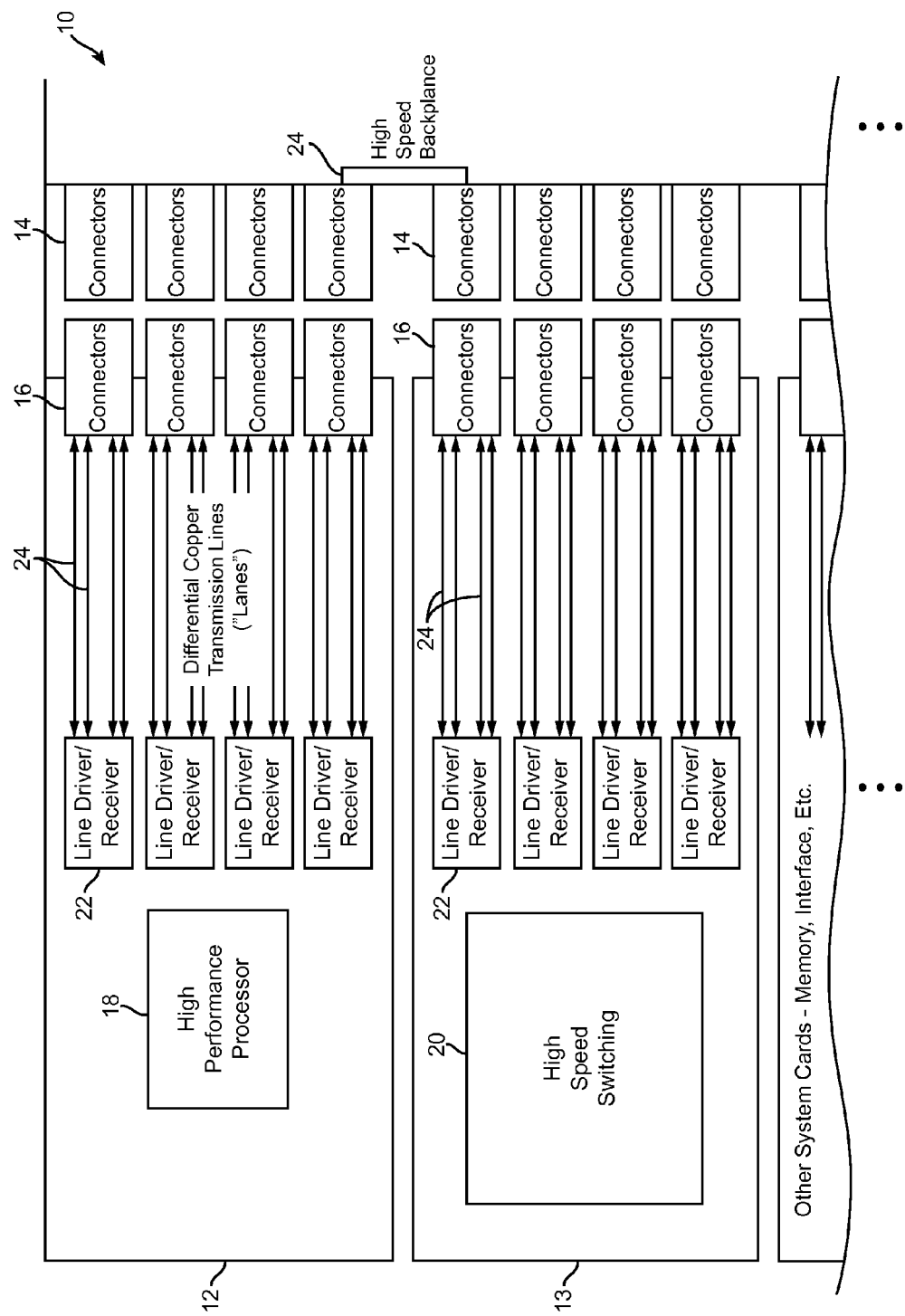
FIG. 1 illustrates an existing high speed hard wired backplane in accordance with prior art.

Example embodiments are described herein in the context of a system and method for wireless communication in a backplane mesh network architecture environment. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. It is understood that the phrase "an embodiment" encompasses more than one embodiment and is thus not limited to only one embodiment. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Existing structures for housing high speed digital components, such as servers, have rack-mountable cabinets with internal printed circuit cards or blade slots, also referred to herein as "blades". The blades carry multiple integrated circuits and other supporting circuitry and are plugged into a backplane printed circuit board that provides a set of interconnection pathways or lanes between the blade slots. Existing methods for interconnection of the high speed digital components (e.g. blades, backplanes and cabinets) or modules (e.g. integrated circuits, memory storage, processors, interfaces) rely on copper printed circuit traces and/or copper or fiber optic cabling. The copper or fiber is the physical medium used to transport electrical or optical signals. The total number of interconnects and lanes within a given system is fixed, and extensibility is limited by the fixed nature of the physical media.

Since the components are randomly interconnected to each other on an as-needed basis to allow for flexible component to component communications, the lanes and/or cables are typically routed to a centralized switching blade or switching cabinet. If a given originating component needs to communicate with any other component in the system, it must be interconnected with the centralized switching module so that the centralized switching module can switch and direct the originating component signals to the desired destination component. The centralized switching module has a fixed number of input and output connections and represents another fixed resource in the system that limits ultimate capacity and extensibility of a component based system.

It should be noted that the physical implementation of a system of computers, servers and software can be within a single blade, or within a cabinet (with multiple blades); as a group of multiple cabinets within a rack; and/or as a group of racks within a larger space such as in a data center. The architecture of requiring a centralized switching module is the same regardless of the scale of the system; whether switching between components on a single blade; between blades via a backplane; between cabinets via cables to a switching unit; or between racks via cables within a data center. The concept of a switched "fabric" broadly encompasses the switched functionality independently of the physical size or of the switching architecture of the system.

FIG. 1 illustrates the traditional high speed hard-wired blade system. As shown in FIG. 1, the blade system includes one or more backplanes 10 having several connectors 14 as well as one or more printed circuit board blades 12, 13 each having several connectors 16 whereby the blades 12, 13 are coupled to the backplane 10 via the connectors 14, 16. In the embodiment shown in FIG. 1, the blade 13 has a processor 18 and the blade 12 has a high speed central switch 20. Additionally, other system blades having circuit modules that are not shown (e.g. memory, interfaces, processors) are contemplated to be connected to the backplane via corresponding connectors. In addition, each blade 12, 13 includes several line drivers/receivers 22 which are hardwired to the connectors, whereby signals are routed between the blades 12, 13 and the backplane. In particular, the processor 18 and the central switch 20 in the blades 12, 13 are shown to include four line drivers/receivers 22 which are connected to their respective blade connectors 16 using differential copper transmission lines 24. Additionally, the backplane 10 is hardwired between connectors 14 to allow signals to travel between the processor blade 12 and the central switch blade 13 as well as other modules in other blades. Note that the physical placement of the backplane relative to the blades may be at one end or between sets of blades in the middle of an enclosure (known as a midplane).

The existing configuration in FIG. 1 has many disadvantages. Signals from one module to another must travel through the hardwire lines 24 in the blades 12, 13 as well as the backplane 10 and through the connectors 14, 16 between the blades 12, 13 and the backplane 10. Additionally, all inter-blade communications must travel to the central switch 20 to be properly routed to the destination module. This translates into a substantially complex fabric having latency and delay issues. The capacity of existing hard-wired backplane systems is also limited by the physical layout and number of wired physical interconnects between elements in the system. Once the existing number of interconnects, or lanes is used, the data communications capacity of the system is limited. Adding additional elements within the system is impossible without re-design of the entire backplane and interconnect structure. Further, the cost in manufacturing the blades and the backplane as well as the connectors and copper transmission lines can become very expensive.

To overcome these disadvantages and limitations, the novel system described utilizes a plurality of wireless transceiver modules, also referred to as nodes, preferably disposed on printed circuit boards. Each node has autonomous intelligent routing and switching capability to allow the nodes to communicate with one another wirelessly without the use of expensive interconnects or copper tracing. The resulting tightly coupled mesh network of transceiver modules provides a less expensive solution which utilizes less power than centralized and hard-wired backplane systems.

Figure 2:
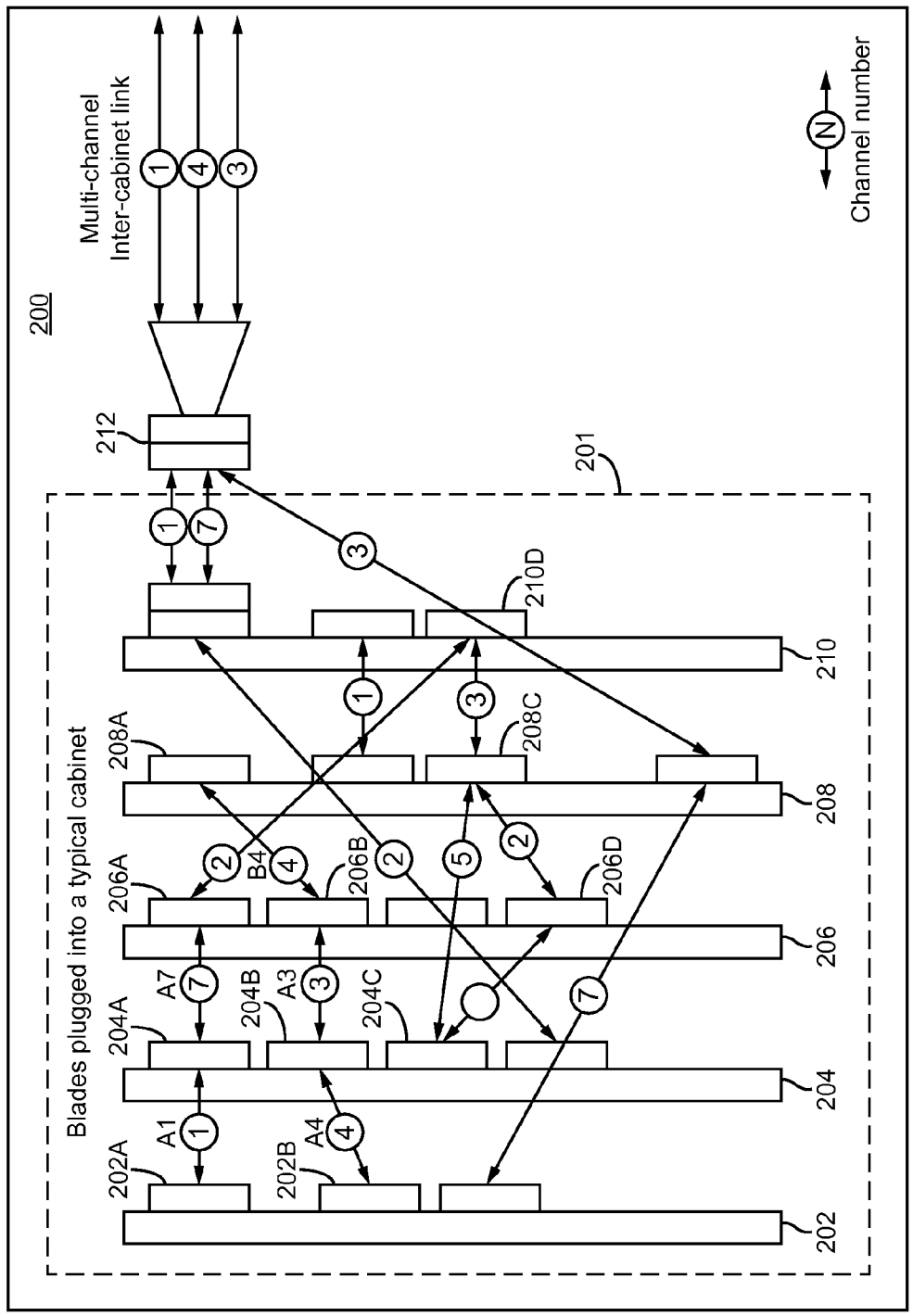
FIG. 2 illustrates a general diagram of a wireless antenna node backplane system in accordance with an aspect of the present disclosure.

FIG. 2 illustrates a wireless backplane fabric system in accordance with an aspect of the present disclosure. As shown in FIG. 2, several printed circuit board blades 202-210 (generally referred to as blade or blades) include one or more nodes 202 and are placed in a common cabinet 201 or in different cabinets spaced apart from one another. As will be discussed in more detail below, the blades 202-210 communicate with one another within a cabinet or across spaced cabinets 201 using wireless nodes. In an aspect, blades housed in portable or non-portable electronic devices that are spatially apart from one another are able to perform wireless backplane communications using the nodes.

Each node is coupled to a power source as well as the module(s) that the node serves (e.g. blade, processor, memory, interface, etc.). In particular to FIG. 2, blade 202 includes three nodes 202A, 202B, 202C; blade 204 includes four nodes 204A, 204B, 204C, and 204D; blade 206 includes four nodes 206A, 206B, 206C and 206D; blade 208 includes four nodes 208A, 208B, 208C and 208D; and blade 210 includes four nodes 210A and 206B stacked on one another, 210C and 210D. It should be noted that any number of blades, including only one, are contemplated and each cabinet may have one or more blades disposed thereon. It should be noted that any number of nodes may be configured on the blades, including only one node, and the number of nodes on the blades are only exemplary in FIG. 2. Although the nodes are shown on one side of the blades in FIG. 2, it is contemplated that the nodes may be disposed on the other side of the blade or both sides of the blades. It should also be noted that it is not necessary that the nodes even be disposed on a blade. For instance, the nodes may be integrated into one or more modules such as a memory, processor, interface, etc., whereby the module itself is mounted on the printed circuit board blade. It should be noted that although the nodes are primarily discussed in relation to be mounted onto to blades in a backplane fabric application, the nodes may be used in a more general sense in which two or more modules, for example a processor and a memory physically separate from one other may exchange data wirelessly using the nodes described herein.

As shown in the aspect in FIG. 2, one or more nodes are configured to pass data signals to an external antenna node that is positioned externally to the cabinet structure 201 to allow wireless backplane signaling and communications between blades in physically separate cabinets. For example, a node, such as antenna 212, may be placed internally or externally to the cabinet structure 201, wherein the antenna 212 is optimized for transmitting and receiving backplane signals connectivity to nodes within the cabinet and/or nodes in other spatially separated cabinets. This provides the ability for the system 200 to extend the mesh network beyond the internal cabinet space and thus extend the system 200 to serve as a backplane to other cabinets of an entire data center fabric. More details of the antenna 212, itself, are described and enabled below.

The extensibility of the described system 200 utilizes network capacity as a function of spectrum bandwidth and modulation efficiency with effectively no limit set by the physical interconnects, central switches, cables or number of physical conducting lanes as in hard-wired systems. It should be noted that although it is described that the inter-cabinet communicating node is external to its cabinet, it is contemplated that the node may be included within the cabinet or disposed on a blade within the cabinet. The inter-cabinet communicating node would be configured to have a higher power and sensitivity setting and/or a dedicated time slot and/or channel to allow signals to be sent without interfering with the mesh network within that node's own cabinet.

As will be discussed, the nodes are wireless transceivers programmed to selectively communicate with other nodes to relay data signals in the millimeter wave frequency range therebetween and/or among blades without the need of using connectors, a central switching module, hardwires or fixed backplane architectures. Each node is thus wirelessly coupled to other modules on the blade and operate to dynamically and automatically determine and select when and where to send signals along with the predetermined frequency channel, time slot, transmission power level, receiving sensitivity level and/or other parameters based on sensing of the network's spectral, data, and power conditions. Each node effectively is an autonomous switch, thereby providing each blade with its own set of switches. This is in marked contrast to existing backplanes which use a central switch shared among a plurality of blades.

Figure 3:
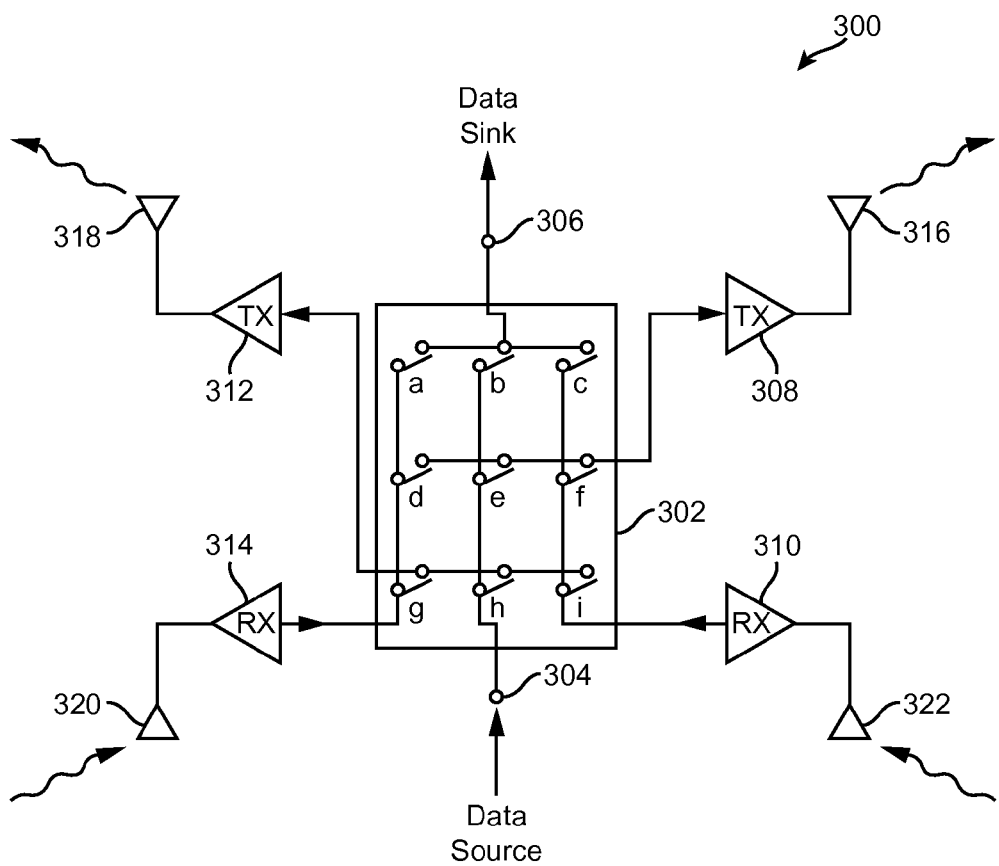
FIG. 3 illustrates a circuit schematic of a wireless node of the backplane system in accordance with an aspect of the present disclosure.

FIG. 3 illustrates a schematic of the node in accordance with an aspect of the present disclosure. It should be noted that the operation of the node can be done via hardwire components, as described in FIG. 3, and/or via software components, as described in FIG. 5B. In an aspect, the node 300 is operated in association with a communication device (FIG. 8C), wherein the node 300 includes one or more transmitter communication elements which includes a corresponding transmitter circuit and antenna, and one or more receiver communication elements which includes a corresponding receiver circuit and antenna. In an aspect, the node 300 includes two sets of transmitter communication elements, namely a first set having transmitter 308 coupled to antenna 316 as well as a second set having transmitter 312 coupled to antenna 318. In an aspect, the node 300 includes two sets of receiver communication elements, namely a first set having receiver 314 coupled to antenna 320 as well as a second set having receiver 310 coupled to antenna 322. The transmitters 308, 312 and receivers 310, 314 serve to modulate, power and control the signals correspondingly transmitted or received via their respective antennas. In an embodiment, the transmitters 308, 312 and receivers 310, 314 are configured to have multiple-in, multiple-out (MIMO) or other smart antenna capabilities to allow increased spectral efficiency, link reliability and/or diversity, such as reduced fading. It should be noted that the circuit shown in FIG. 3 is exemplary and is not to be considered limiting to what is shown in the Figure.

In addition, the node 300 includes data switching and routing circuitry and/or embedded software (firmware) that controls the node's functionality. In an aspect, a circuit 304 is connected via hardwire to the data source such as a module or another node; and a circuit 306 connected via hardware to the data sink such as a module or another node. In an aspect, the data sink and data source may be the same module (e.g. a memory or processor from and to which data is stored and accessed). Node 300 also includes a switching circuit 302 which includes a plurality of individual switches 302(a) through 302(i) (all shown in FIG. 3 as being open), each of which can be independently controllable. It should be noted that although nine individual switches 302(a) through 302(i) are shown in FIG. 3, it is a non-limiting example and any number of switches are contemplated.

The transmitter antennas 316 and 318 are connected to the transmitter circuits 308 and 312 respectively. In an aspect, the inputs to the switching circuit 302 are connected to data source 304, receiver 310 and receiver 314. In an aspect, outputs from the switching circuit 302 are preferably connected to data sink 306, transmitter 308 and transmitter 312. In an aspect, switches 302(a)-302(i) in switching circuit 302 can independently connect any input circuit to any output circuit.

The data source 304 may additionally or alternatively provide data to instruct the node 300 to execute a particular operation. For example, the operational instructions received by the node 300 may indicate the address of the destination node and/or intermediate nodes, the level of power which will be attenuated by the transmitter, the time slot in which the signal will be communicated, the desired channel of the signal, the frequency at which the signal will be communicated, and/or the data rate of transmission and/or sensitivity at which the receiver must be at to properly receive the signal. In an embodiment, the operational instructions or a portion thereof may be included in the signal wirelessly received by antenna(s) 320, 322, whereby such instructions are solely used or combined with incoming instructions via the data source 304 to instruct the node 300 of its operation.

Node 300 can be configured for various network switching modalities, some non-limiting examples including, but not limited to: a receiver connected to the local data sink; a receiver connected to a transmitter for wireless repeating functionality; a receiver connected to a transmitter and a second receiver connected to a second transmitter for multiple repeating functionality; and/or a receiver connected to both the local data sink and to one or more transmitters for simultaneous repeating functionality.

An example would be a wireless signal to local data sink function, whereby the receiver 310 receives a wireless signal via antenna 322 and connects to data sink circuitry 306 via closed switch 302(c). An example would be the node 300 wirelessly receiving data and storing the data in a memory, whereby the memory is represented as the data sink. Additionally or alternatively, the additional repeating function can be enabled by connecting the same signal from receiver 310 to transmitter 308 via closed switch 302(f). If only the repeating function from receiver 310 to transmitter 308 is desired, then switch 302(c) can remain open while switch 302(f) is maintained in the closed position. An example of providing dual simultaneous wireless repeating functionality would be to connect receiver 310 to transmitter 308 via switch 302(f) and also connecting receiver 314 to transmitter 312 via closed switch 302(g).

Another operation of the node 300 would be for a multicast function in which multiple receivers and/or transmitters would be operating simultaneously, such as for operation using multiple-in, multiple-out (MIMO) technology. In an example of the multicast function, receiver 310 would be connected to transmitters 312 and 308 through closed switches 302(i) and 302(f). Similarly, receiver 314 would be connected to transmitters 312 and 308 through closed switches 302(g) and 302(d). Additionally or alternatively, data source 304 would be connected to transmitters 312 and 308 through closed switches 302(h) and 302(e). Note that the relative size in dimension of the switching circuitry 302 is much smaller than a typical centralized large system switch. The smaller dimension and size of the node yields lower propagation delay, lower power required and active switching functionality that is only used on an as-needed basis across the system of wireless mesh nodes in the proposed embodiment.

It should be noted that the circuit shown in FIG. 3 is an example of the node, and it will be appreciated that circuit configuration as well as the number of antennas, transmitters, receivers, data sinks and data sources may vary depending on the application of the node. In an embodiment, the transmitter and receiver antennas are in an opposed configuration as shown in FIG. 3. This configuration shown in FIG. 3 allows the transmitting antenna 316 and the receiving antenna 322 to communicate with wireless signals on the one side of the node whereas the transmitting antenna 318 and the receiving antenna 320 are able to communicate with wireless signals on the opposite side of the node in a symmetrical manner. Although the configuration of the opposed transmitting and receiving antennas are preferred, it is contemplated that a non-symmetrical antenna configuration can be implemented. It should be noted that although the circuit described herein has a particular configuration, it should be noted that other configurations are contemplated and are not limited to the example circuit.

In an aspect, the node 300 operates in a half duplex mode in which the node 300 either transmits or receives data, such that the node 300 does not receive data during transmission and does not transmit data while receiving data. In an aspect, the node 300 operates in a full duplex mode in which the node 300 simultaneously transmits and receives data via its respective antennas. It should also be noted that although the node 300 is described as including one or more transmitter and receiver antennas, it is contemplated that the node 300 may alternatively have only transmitting or receiving capabilities.

The transceiver node 300 is able to perform a variety of functions to allow effective communication between electronic devices, modules, blades and/or cabinets. The node 300 is able to receive data from a data source 304, such as a local connection on the plane, and transmit the data or a portion of the data wirelessly via either or both of the transmitter antennas 316, 318. In an embodiment, the data source 304 may be connected to the node by a hard wire, although the node may receive signals from the data source 304 wirelessly. The node 300 is also capable of receiving data from the data source 304 and transmitting the data to the data sink 306. Additionally, the node 300 is capable of performing repeated functionality in which the node 300 receives data wirelessly from either or both receiver antennas 320, 322 and transmits the data (or a portion thereof) to either or both of the transmitter antennas 316, 318, thereby acting as an intermediate node between one or more source and destination nodes 300. Additionally or alternatively, the node 300 is able send the received data (or a portion thereof) to the data sink 306. In an aspect, the switches of the node 300 are hardware logic based, although operation of the switches in the node 300 may be alternatively/additionally be controlled by software. In an aspect, each transceiver node 300 can arbitrarily or selectively assign a millimeter wave frequency channel of selectable channel spectrum width for transmission and reception of data independent from a set of frequency channels within a given millimeter wave band.

Figure 6A:
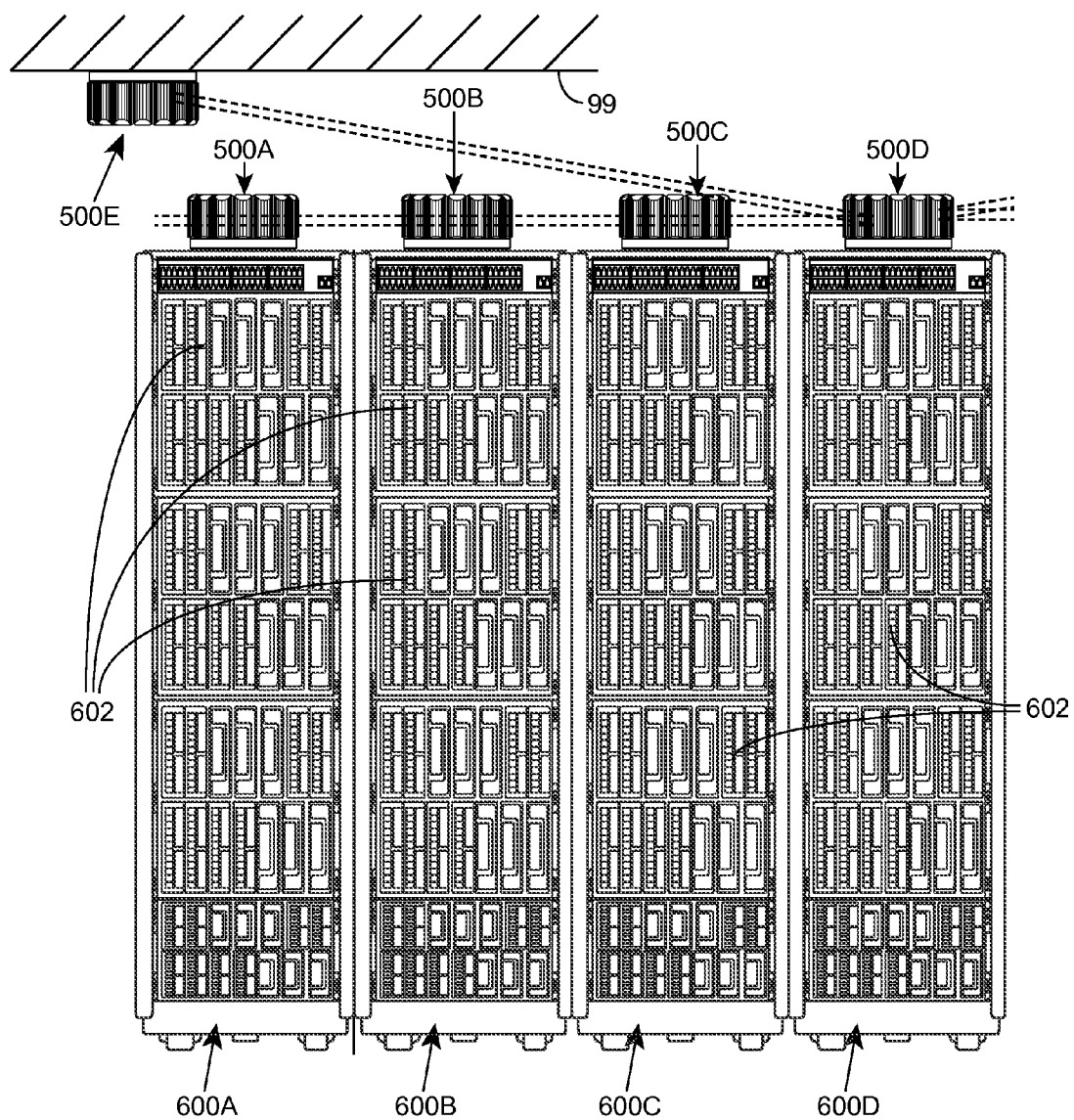
FIGS. 6A-6B illustrate example diagrams of server rooms containing a mesh wireless node system in accordance with an aspect of the present disclosure.
Figure 6B:
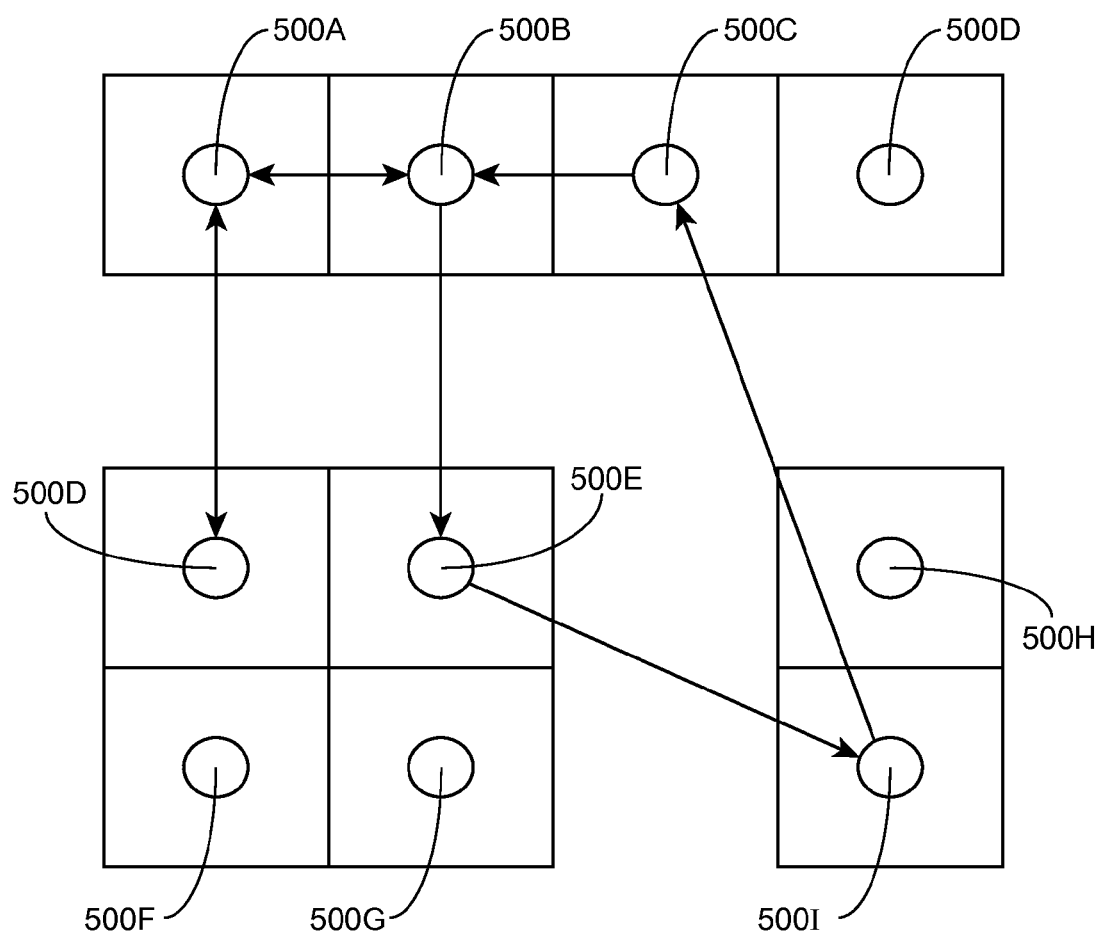

Referring back to FIG. 2, each node is able to receive operational instructions and communicate data signals in conjunction with those operational instructions to effectively operate in a wireless backplane fabric. The arrows shown in FIG. 2 represent data communication connection channels between two or more respective nodes, whereby the connection channel is established and data is transferred wirelessly using electromagnetic radiation or RF signals in the millimeter wavelength or 60-240 GHz range. It should be noted that the description in FIG. 2 refers to the wireless communication between nodes, and is contemplated to be applied to wireless communication between nodes located on different server cabinets (FIGS. 6A and 6B).

For example in FIG. 2, wireless node 202A has a wireless connection with node 204A (arrow 1A), whereby data signals are passed wirelessly at time slot A on connection channel 1.

In the example, node 204A is communicating data signals with node 206A at time slot A but on connection channel 7 (arrow A7), and node 202B is communicating with node 204B at time slot A on connection channel 4 (arrow A4), at substantially the same and/or different times.

In an aspect, the present novel system utilizes various time divisional multiplexing access (TDMA) and/or frequency division multiplexing access (FDMA) techniques to efficiently and effectively communicate data signals wireless among nodes within and between spaced blades 202-210. It should be noted that the present novel system can utilize other channel access methods or multiple access methods.

Regarding FDMA, the nodes are configured to communicate in the same time slot at different frequencies. In the example in FIG. 2, FDMA techniques can be utilized such that, for a different time slot B, node 206B communicates with node 208A using channel 4, shown as arrow B4, (the same channel between 202B and 204B) without interfering with the signal transfer between nodes 202B and 204B. Regarding TDMA, the system can alternatively/additionally utilize TDMA techniques to allow multiple pairs of nodes to communicate on the same frequency channel at different time slots.

In an aspect, the system can utilize FDMA and TDMA techniques together to apply a spectrum access technique to pass data between nodes. For instance, the nodes can utilize a frequency hopping spread spectrum (FHSS) technique in which the transmitter and receiver nodes communicate data over a specific sequence of coordinated frequency changes over set time slots. Spread spectrum techniques mitigate co-channel interference in tightly coupled electromagnetic environments and allow multiple transceiver nodes to simultaneously communicate data using different frequency hopping sequences. Other autonomous routing, control, modulation and access parameters are contemplated for use by the system which include but are not limited to: sensed propagation channel conditions, modulation index selection, transmit power level selection, receive sensitivity level selection, and antenna beam heading selection.

In an aspect, the system 200 is able to adjust the gain and sensitivity of one or more of the nodes to allow signal transfer at the same time and/or frequency channel of a communication between other nodes without interfering with other existing communication channels. As shown in FIG. 2, node 204B and 206B are shown communicating at time slot A on frequency channel 3 (arrow A3) while nodes 208C and 210D are communicating at the same time slot and frequency. To prevent any interference between the two pairs of nodes, the nodes 204B and 206B are instructed to have their respective gains/sensitivities adjusted at a level low enough such that the signal does not interfere with the channel between nodes 208C and 210D (while achieving optimal data transfer) and vice versa. In an aspect, the nodes are precisely controlled to allow them to efficiently and effectively communicate with one another without generating interference by selectively using different channels, time slots and utilizing power and/or sensitivity levels.

In an aspect, multiple nodes operating simultaneously may be selected either from within a single transceiver module or among several modules for improved spectral efficiencies using space-time coding parameter selection (as used in multiple input multiple output "MIMO" systems). The environment for the use of the described system is within cabinet structures and between cabinets in a data or computing center (FIGS. 6A and 6B). The interior of a cabinet contains multiple cards or blades and typically has electromagnetic environments with highly reflective surfaces and propagation paths that will randomly vary from line-of-sight to highly scattered. In an aspect, the system is configured to allow the individual nodes to control various parameters themselves, including but not limited to: transmitting power settings, receiving sensitivity settings, channel frequency, antenna beam heading settings, modulation efficiency, MIMO space-time coding, multiplexing techniques and the like.

In an aspect, by using millimeter wave frequencies (typically 60 GHz and higher) with wavelengths on the order of a few millimeters in conjunction with variable parameter control, the system is able to control communications distances between nodes to within a few centimeters. However, it is contemplated that communication channels can be established (and data thus transmitted over those channels) over greater distances between nodes. In an aspect, the nodes communicate at 60 GHz and in particular, the 57-64 GHz range. In an aspect, the nodes communicate at the 120 GHz and/or the 240 GHz range. However, in the present application, 57-64 GHz frequency range is used in describing the system. Of course, it should be noted that the system is able to operate effectively at other frequencies and in other frequency ranges and is thus not limited to the above values.

During operation, the nodes are able to communicate with one another in which one or more source nodes select one or more destination nodes (as well as one or more intermediate nodes) to communicate data over communications channels. The transmitting or source node then selects and establishes a connection channel to wirelessly transmit (and possibly receive) data to the destination node(s) directly or through the intermediate node(s) using the millimeter wave frequency range. The source node is preferably programmed to have a predetermined selected power setting and the destination node is programmed to have a predetermined selected sensitivity setting to allow successful communication of the data packets between the nodes.

In particular, each node identifies its operating parameters or profile each time it establishes a connection channel and sends data over the connection channel to one or more destination nodes, whereby the operating parameters or profile is attached to header information of the data packets. The operating parameters include, but are not limited to, routing information, selected multiplexing instructions, gain/sensitivity instruction data and other relevant information to allow a successful channel connection and data transfer between the source and destination nodes. In an aspect where the multiplexing instructions are directed to a set frequency hopping sequence, specific channel sequence and associated time counter instructions are included with the operating parameters.

In an aspect, a network protocol is used to provide a transport mechanism that contains both data payload and network overhead information, along with standard packet information such as start, length, addresses, cyclic redundancy check (CRC), etc. The network overhead information includes operational information needed by the nodes for communicating their internal parameters. In-place wireless standards (such as IEEE 802.11, 802.11n, 802.15 and/or 802.16) may be used to form the basis of the medium access control (MAC) layer with additions for the specialized physical layer requirements in a closely-spaced, millimeter wave mesh network using a frequency hopping protocol. In addition, when highly directional antennas are used, spatial separation allows frequency division multiplexing (FDMA) and full duplex operation.

One particular protocol, although only an example, may be:

[(start of packet, length, pads)–(source and destination addresses)–(network overhead)–(data xxxxxxxxxxxxx payload)–(cyclic redundancy check)–(end of packet)]

In an aspect, along with each transmission, each node provides the profile information of itself and/or one or more intermediate nodes which are in proximity and/or are of interest to the transmitting node ("neighboring node"). Such profile information may include addresses of one or more identified nodes, frequency hopping sequences, gain/sensitivity information, bandwidth information, time counters and other relevant general or specific information of the identified nodes. As such, the profile information of the neighboring nodes allow the destination node(s) to have status information of other nodes in the environment to allow the destination node(s) to make routing decisions or perform other functions to ensure efficient network backplane connectivity. For example, the profile information may provide quality of link information that identifies one or more nodes, neighboring the destination node, which have often dropped or timed-out on an established connection channel. In another instance, the quality of link data may indicate that there is a risk of crosstalk interference due to the positioning of the neighboring node with respect to the destination node and/or other components, etc. Once the destination node receives the profile information, it stores the information in a local memory, whereby the destination node (acting as a source or transmitting node) can access the stored profile information in the memory and analyze profile information of the other nodes in the environment when deciding a connection channel route over which it is to transmit data packets.

In an aspect, the nodes may supply profile information of other nodes in header information when establishing a connection channel. Such profile information is supplied in each transmitting signal to ensure that the receiving node or nodes are always updated with the status of other nodes in the system. In another aspect, each node periodically provides profile information of other nodes that it has locally stored to one or more other nodes to ensure an up-to-date and consistent snapshot of the node environment. In other words, the system will constantly be updated with node profile information at any instantaneous point.

By sharing profile information among the various nodes, each node will have relevant status information of other nodes in the system, thereby allowing the nodes to operate as a "smart" switching system without the need of a central switching module. For example, referring back to FIG. 2, node 204C, by knowing the profile of the node 208C (either directly from node 208C or its neighbors), is able to directly transmit data wirelessly to node 208C. In doing so, the node 204C inserts the destination address of node 208C in the data packet, along with node 204C's current profile with the other desired or necessary data, and transmits the packet to node 208C. The signal is transmitted on the frequency channel which corresponds to one of the frequencies being used by node 208C to receive data and is transmitted once, a predetermined amount of times, or continuously until the receiving node 208C receives the message. Upon receiving the message from node 204C, node 208 immediately sends an acknowledgement message back to node 204C on the same frequency channel or on another frequency channel. In an aspect, the node 204C, upon receiving the acknowledgement message, transmits an acknowledgement-acknowledgement message back to node 208C.

In another example aspect, node 204C may be informed (using profile information from node 208C or another node) that node 208C has adjusted its sensitivity to only be able to receive signals from nodes immediately next to node 208C or some other distance which prevents node 204C from directly communicating with node 208C. In this example, node 204C will modify the routing instructions such that the message, which has an ultimate destination address of node 208C, will travel through intermediate node 206D. Node 204C would thereby transmit its packet to node 206D (or any other chosen node), whereby node 206D upon receiving the packet will process the routing instructions for the connection and send the packet to destination node 208C. In addition, in acknowledging the packet to node 204C, node 206D may send two separate acknowledgements (one for receiving the packet from the source and one for receiving the acknowledgement from the destination) separately or together.

In an aspect, the system is able track, store and/or analyze all communications between nodes to improve operation of the overall wireless node network. In an example, the system tracks, stores and/or analyzes the number of successful and unsuccessful connections between nodes. Additionally or alternatively, the system can track and store the number of interference events, timeouts, signal drops, and/or other network related data between nodes to provide a statistical analysis or history to allow the system to improve communications between nodes. This information may also be analyzed by an administrator or designer to improve the operation the wireless node network. For example, the system may analyze tracked information indicating that node 202A commonly drops signals with node 204A when node 204A acts as an intermediate node between node 202A and any other node. In the example, the system uses this information to instruct the node 204A (and all the other nodes) to no longer act as an intermediary for node 202A. In an embodiment, the system can use the tracked information as a diagnostic tool for improving the system.

The system is scalable in that the system can handle a change in the number of nodes (e.g. increased or decreased in number) and immediately begin communicating and transferring data with the modified system. The registration process of a new node will now be discussed. In an aspect, upon a new node coming online, the node proceeds to an acquiring mode in which it is assigned a random or preselected frequency hopping scheme as well as a random or preselected time counter scheme. Upon being assigned its operating protocol, the new node transmits an announcement message to one or more other nodes by running through its assigned frequency scheme, in which the announcement message may include the new node's operating profile.

In an aspect, upon the other nodes receiving the announcement message, the receiving nodes transmit an acknowledgement message back to the new node, whereby the acknowledgment messages confirm receipt of the announcement message. In an aspect, the acknowledgement messages may include local and/or global profile information of the nodes in the system. Upon receiving the acknowledgement message, the new node stores this information and is able to handle communications with the other nodes.

In an aspect, one or more nodes may be configured to serve as an interface module, as an addition or substitute, to Bluetooth, USB, firewire, infrared, etc., to allow communication with an external device. In an example, an interface node may be configured in a laptop computer whereby the laptop interface node can sense, configure and automatically begin wirelessly communicating with a mobile phone, PDA, media player or other electronic device also having a transceiver node as that described herein. The system and method described herein can be used on various interfaces and existing fabrics for different market sectors such as Ethernet, Myrinet, Infiniband, etc. The system may be used to communicate between two or more electronic devices which traditionally use wires or cables (e.g. television and video equipment, audio receiver and remote speakers, servers in a server stack; multiple server stacks in a data center). The system may also be used to allow data communication between components within a single housing (e.g. between processor and memory in a high definition video camera). As will be discussed in more detail below, one or more nodes of blade(s) of a server stack can communicate with one or more nodes of servers in another server stack using the 60-240 GHz frequency range via one or more antenna nodes 212, as will be discussed in more detail below.

Figure 4:
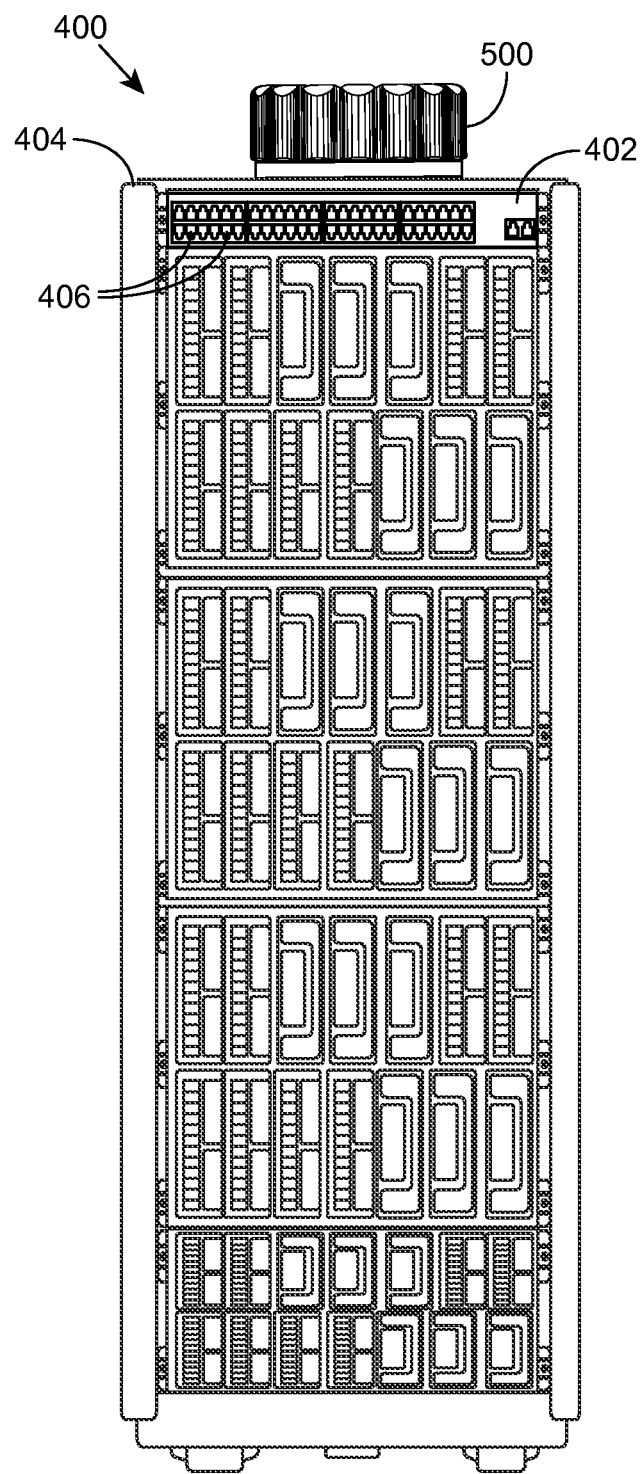
FIG. 4 illustrates an example diagram of the antenna node system in accordance with an aspect of the present disclosure.
Figure 5A:
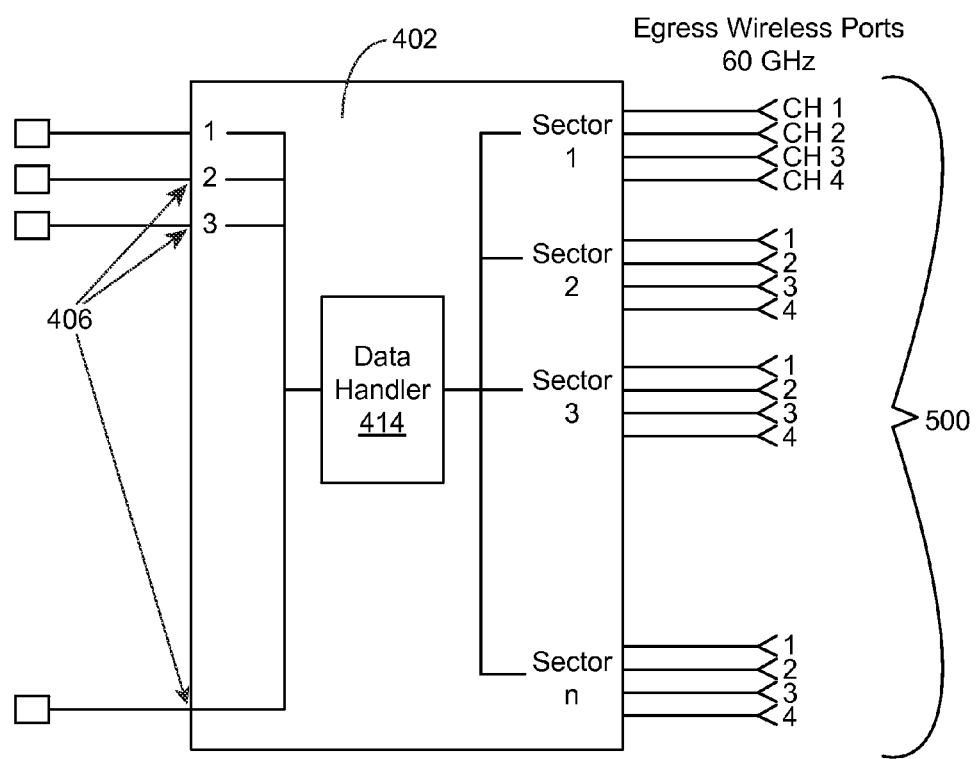
FIG. 5A illustrates a functional diagram of the antenna node system in accordance with an aspect of the present disclosure.
Figure 5B:
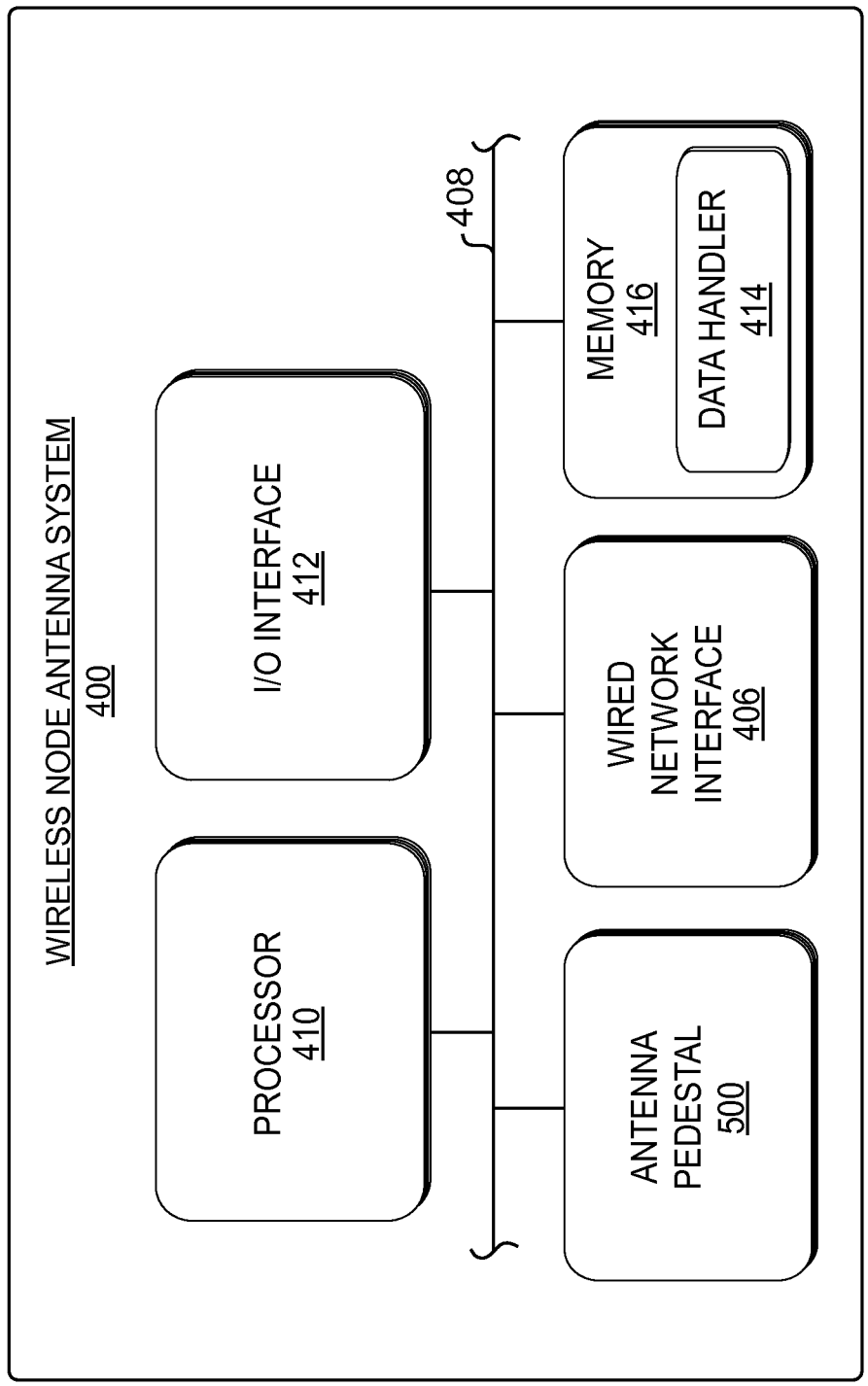
FIG. 5B illustrates a block diagram of the antenna node system in accordance with an aspect of the present disclosure.

FIG. 4 illustrates an example wireless node antenna system located in a server device cabinet in accordance with an aspect of the present disclosure. FIG. 5A illustrates a base of the example wireless node antenna system in accordance with an aspect of the present disclosure. FIG. 5B illustrates a block diagram of components of the antenna system in accordance with an aspect of the present disclosure.

In general, each wireless node system 400 functions as an intelligent backplane switch and router used in a close area mesh network. The node systems 400, in aggregate, employ directional antenna pedestals 500 configured to target and wirelessly beam data over a 60-240 GHz frequency band to other antenna pedestals of other server cabinets in a data center. Since 60 GHz has such a short wavelength (5 mm), the antenna system 400, using processing and hardware capability, can achieve very high directivity with relatively small sized antenna pedestals 500. Note that there are no additional switches in this architecture, it is essentially a single-tier or flat mesh network composed of a plurality of antenna systems 400 and their wireless pedestals 500.

As shown in FIG. 4, the node antenna system 400 includes an electronic switch base 402 and one or more antenna pedestals 500. In an aspect, the antenna system 400 is configured as a Top Of Rack (TOR) device that is located near the top of a server cabinet 600 housing a plurality of server processors and/or server blades 602 (See FIGS. 6A and 6B). As shown in FIGS. 6A and 6B, the antenna pedestal 500 sits on and/or above the cabinets 600 to allow wireless millimeter wave communications with other wireless pedestals of other server cabinets in a data center or server room.

Although it is shown that the pedestal 500 is directly mounted to the base 402 in FIG. 4, it is contemplated that the pedestal 500 can be alternatively coupled to the base 402 by hardwire (or wirelessly) such that the pedestal 500 is not directly mounted to the base 402 but is mounted to another object. For instance, one or more pedestals 500E may be mounted to the ceiling 99, as shown in FIG. 6A.

It should be noted that although the antenna system is designated as being located on a top surface of a server cabinet, the antenna system can be utilized elsewhere with respect to the server cabinet. It should be noted that at least one antenna pedestal may be located on a side or bottom of a server cabinet in another aspect. It should also be noted that the antenna pedestal may be configured to operate with electronic devices other than servers, such as portable or non-portable electronic devices. For example, the antenna system 400 may be used to allow data wireless communications between two portable or non-portable electronic devices.

As shown in FIGS. 4 and 5A, the base 402 of the antenna system 400 includes a plurality of server ports 406 configured to receive hardwired Ethernet cables connected to the corresponding network devices (e.g. servers 602) housed in the cabinet 600. In particular, as will be discussed in more detail below, a data handler module 414 in the system 400 handles data messages that are received via the network interface 406 and configures the data messages to be transmitted wirelessly through one or more sectors (shown as Sectors 1, 2, 3 . . . n) of the antenna pedestal 500 via one or more selected channels. Similarly, the data handler module 414 of the system 400 handles data messages that are received via one or more sectors of the antenna pedestal 500 and configures the received data messages to be sent to the destination network device 602 via the network interface 406.

FIG. 5B illustrates a block diagram of the wireless antenna system 400 in accordance with an aspect of the present disclosure. As shown in FIG. 5B, the wireless antenna 400 includes a device processor 410 configured to execute computer/machine readable and executable instructions stored in a device memory 416 or elsewhere. Such instructions, when executed by one or more processors, implement network traffic management related functions of the antenna system 400. The processor 410, like the data handler 414, may comprise one or more digital signal processors, micro-controllers, application specific integrated circuits ("ASICs"), programmable logic devices ("PLDs"), field programmable logic devices ("FPLDs"), field programmable gate arrays ("FPGAs"), and the like.

Device I/O interface 412 comprises one or more user input and output device interface mechanisms. The interface 412 may include a computer keyboard, mouse, touchscreen display device, and the corresponding physical ports and underlying supporting hardware and software to enable the antenna system 400 to communicate with the outside environment. Such communication may include accepting user data input and to provide user output, although other types and numbers of user input and output devices may be used.

Network interface 406 comprises one or more mechanisms that receive hardwired Ethernet cables connected to one or more servers and enable the antenna system 400 to send and receive data between the local servers and one or more servers of one or more other spatially distanced server cabinets. In an aspect, the network interface 406 may comprise other appropriate physical ports dedicated to receiving and/or transmitting certain types of network data, such as device management related data for configuring the one or more antenna systems 400 and/or client request/server response related data.

In general, data is communicated via the network interfaces 406 through network communications over one or more Local Area Networks and/or Wide Area Networks using one or more desired protocols (e.g. TCP/IP, UDP, HTTP, RADIUS, DNS). However, it is contemplated that the network interfaces 406 may be configured for use with other communication protocols and types of networks. Network interface(s) 406 are sometimes referred to as a transceiver, transceiving device, network interface card (NIC), and the like.

Bus 408 may comprise one or more internal device component communication buses, links, bridges and supporting components, such as bus controllers and/or arbiters. The bus 408 enables the various components of the antenna system 400, such as the processor(s) 410, device I/O interface(s) 412, network interface(s) 406, antenna pedestal(s) 404, and device memories 416, to communicate with one another. However, it is contemplated that the bus 418 may enable one or more components of the antenna system 400 to communicate with components in other devices as well. Example buses include HyperTransport, PCI, PCI Express, InfiniBand, USB, Firewire, Serial ATA (SATA), SCSI, IDE and AGP buses. However, it is contemplated that other types and numbers of buses may be used, whereby the particular types and arrangement of buses will depend on the particular configuration of the antenna system 400.

Device memory 416 comprises computer readable media, namely computer readable or processor readable storage media, which are examples of machine-readable storage media. Computer readable storage/machine-readable storage media may include tangible, non-transitory, volatile, non-volatile, removable, and non-removable media implemented for storage of information. Such storage media includes computer readable/machine-executable instructions, data structures, program modules, or other data, which may be obtained and/or executed by one or more processors, such as device processor 412. Such instructions, when executed by one or more processors, causes or allows the antenna system 400 to perform actions including implementing an operating system for controlling the general operations, manage network traffic, and perform the process described in the following description in accordance with the present disclosure. Examples of computer readable storage media include RAM, BIOS, ROM, EEPROM, flash/firmware memory or other memory technology, CD-ROM, digital versatile disks (DVD) or other optical storage, magnetic cassettes, magnetic tape, magnetic disk storage or other magnetic storage devices, or any other medium which can be used to store the information.

In an aspect, a handler module 414 is a software based component which handles the smart switching and other operations described above in FIG. 2. The handler module 414 is stored in a memory 416 or other memory stored within or external to the system 400. It is also contemplated that the handler module 414 be configured as a combination of hardware and software components. Although the system 400 is described herein as a standalone hardware device which is coupled to one or more servers, it is contemplated that the system may include one or more components that are handled by the servers themselves, whereby only a portion of the functions described herein are performed at the system 400. In one particular example, the system 400 may include the antenna pedestal 404 only, whereby the other functions described below are handled by one or more network devices (e.g. servers 602). It should be noted that the system 400 could include other types and/or numbers of components and is thus not limited to the example shown in FIGS. 5A and 5B. Specifics of the example components in the antenna system will now be described.

Figure 7A:
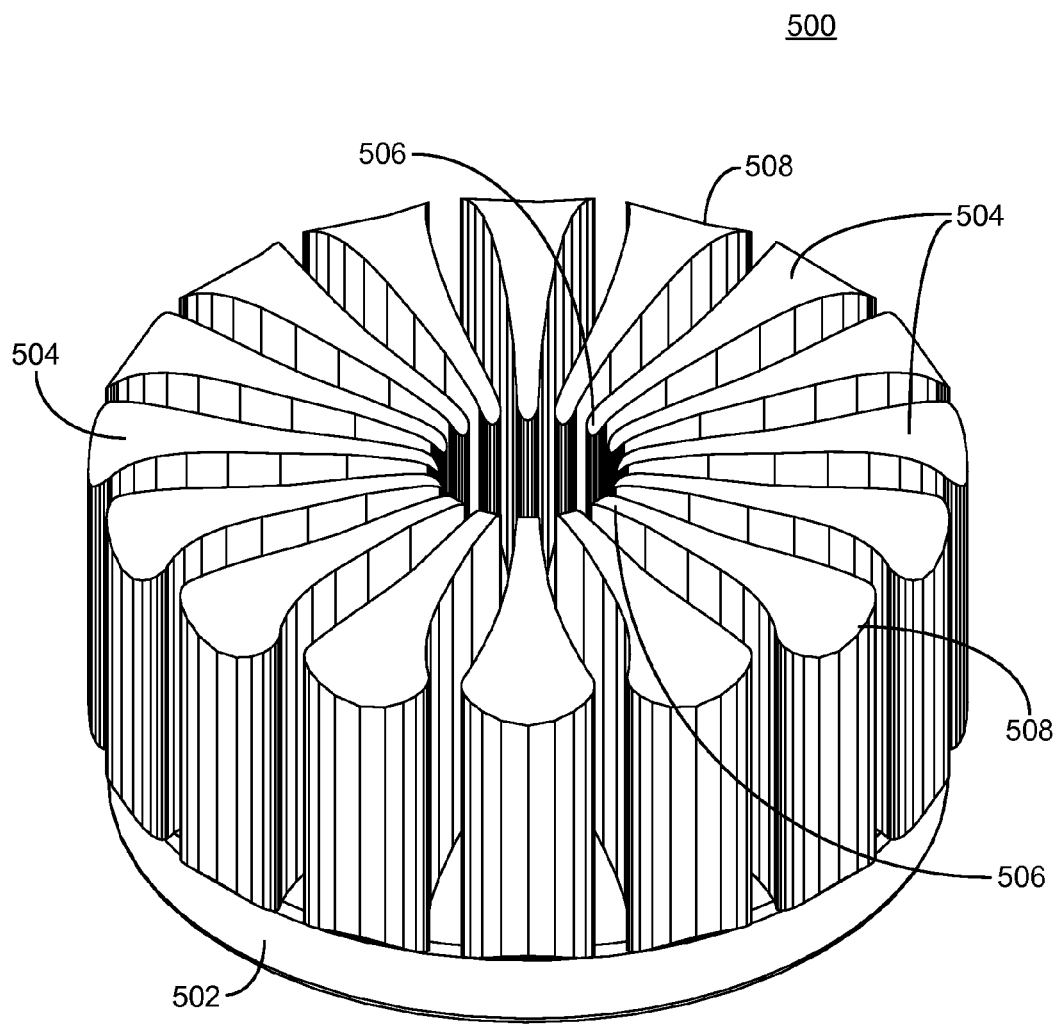
FIG. 7A illustrates a perspective block diagram of the antenna pedestal in accordance with an aspect of the present disclosure

FIG. 7A illustrates a perspective block diagram of the antenna pedestal in accordance with an aspect of the present disclosure. As shown in FIG. 7A, the antenna pedestal 500 includes a base 502 having a plurality of waveguide antenna housing structures 504 (referred to generally as "antenna housings"). The maximum number of antenna housing structures 504 that a particular base 502 can receive and engage is preestablished, although it is contemplated that the base 502 can be designed to receive 8, 16, 32, 64, 128, 256 or any other number of antenna housings 504. In an aspect, the antenna housings 504 are fixedly mounted, along their bottom surfaces, to the base 502. In an alternative aspect, one or more antenna housings 504 are removable from the base 502, as discussed in more detail below.

Figure 7B:
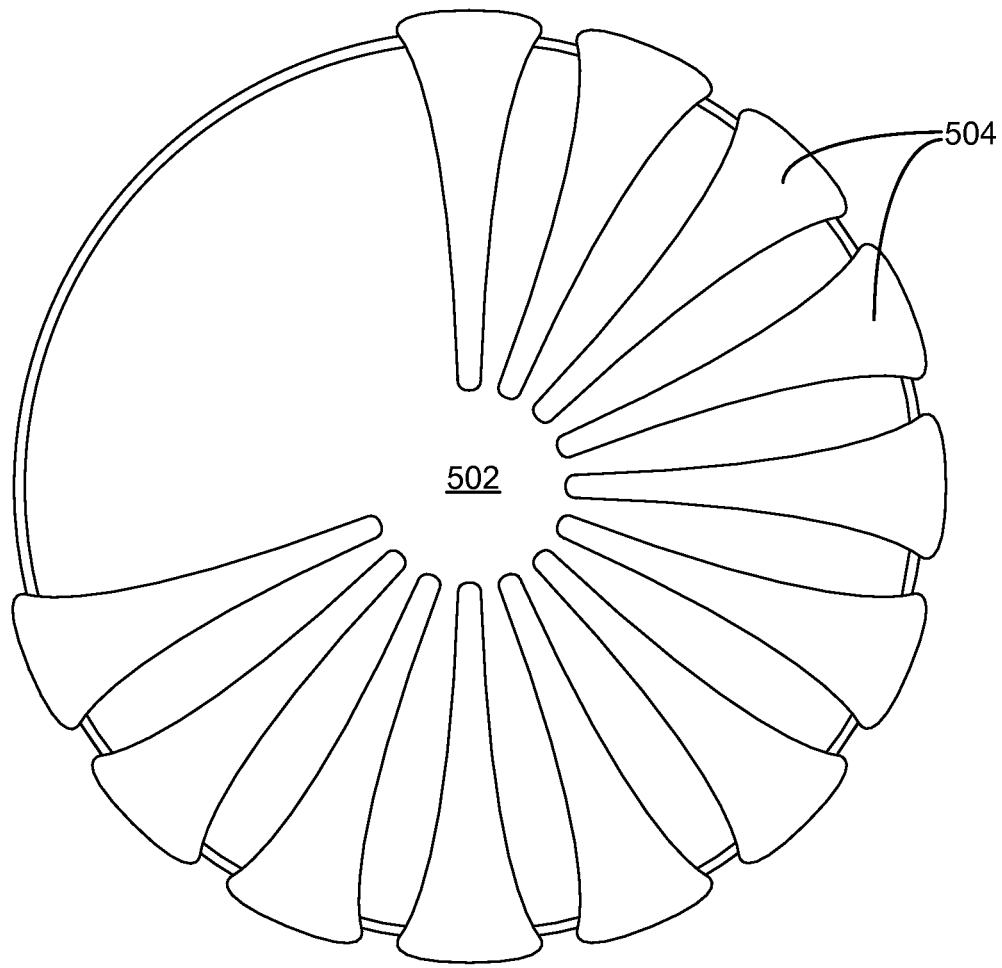
FIGS. 7B and 7C illustrate alternative aspects of the antenna pedestal in accordance with aspects of the present disclosure.
Figure 7C:
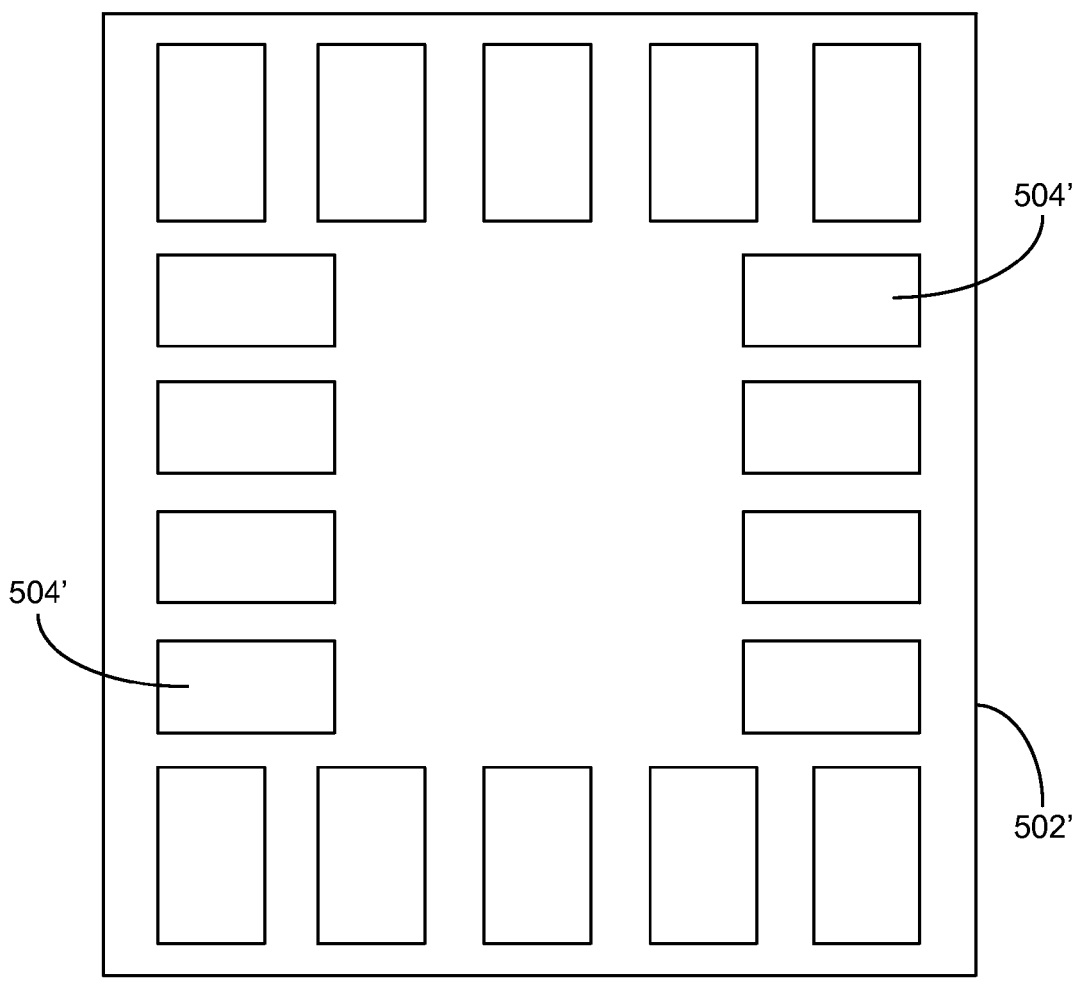

It should be noted that the design described in FIG. 7A and hereinafter is an example and other designs are contemplated. For instance, the base 502 is shown as being circular, but other cross sectional shapes are contemplated (e.g. square, triangular). Also, the particular shapes of the antenna housings 504 shown in the drawings are exemplary and can take form in other appropriate designs. It should further be noted that the particular configuration of how the antenna housings 504 are laid out on the base 502 is not limited to the outward center configuration shown in FIG. 7A. For example, as shown in FIG. 7C, the base 502' of the pedestal 500' is shown as being square shaped, whereby the antenna housings 502' are laid out in a rectangular configuration. As can be seen, the layout configuration of the antenna housings 502' in FIG. 7C is different than the 306 degree circular antenna housing configuration shown in FIG. 7A.

Although not shown in the figures, it is contemplated that the base 502 includes a motor (not shown) which causes the base 502, and thus the antenna housings 504, to rotate about a center vertical axis Z. Additionally or alternatively, it is contemplated that the base 502 includes a motor (not shown) which causes the base, and thus the antenna housings 504, to pivot and tilt about horizontal axis X. Additionally or alternatively, it is contemplated that the base 502 includes a motor (not shown) which causes the base, and thus the antenna housings 504, to pivot and tilt about horizontal axis Y, whereby axis Y is perpendicular to both axes X and Z.

Referring back to the example in FIG. 7A, the antenna housings 504 each have a proximal end 506, which is closer to the center of the base 502, and a distal end 508, opposite of the proximal end 506, wherein the distal end 508 faces in an outward direction from the center of the base 502. In an example aspect shown in FIG. 7A, the pedestal 500 is shown to have 16 antenna housings 504 laid out in a 360 degree circular fashion. However, as mentioned above, the pedestal 500 may be designed to include a greater or lesser number of antenna housings 502. It should also be noted that although the pedestal 500 shown in FIG. 7A has its base 502 covered by the antenna housings 504, it is contemplated that at least a portion of the base 502 may not be covered with antenna housing(s) 504, as shown in FIG. 7B. Although not shown in FIG. 7B, the portion of the base 502' which does not include antenna housings 504' thereon may have interface ports (not shown) which may later receive and engage antenna housings 504'.

Figure 8A:
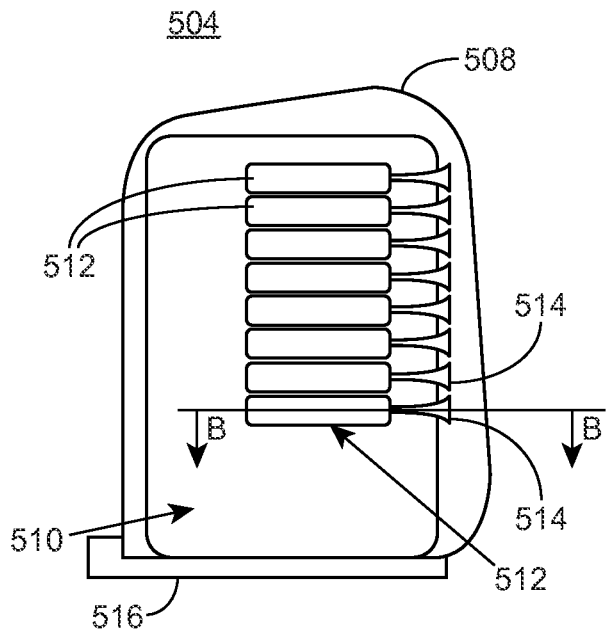
FIGS. 8A-8C illustrate the antenna modules of the antenna housings in accordance with an aspect of the present disclosure.

FIG. 8A illustrates a side view of a waveguide antenna housing structure in accordance with an aspect of the present disclosure. In particular, the antenna housing 504 includes a random lid 508, an inner support member 510, one or more antenna modules 512 and an interface 516. It should be noted that the inner configuration of the antenna housing 504 shown in FIG. 8A is exemplary and that it is contemplated that the inner configuration of the antenna housing 504 may be different to include additional, fewer and/or different inner components.

As shown in FIG. 8A, the antenna housing 504 includes a plug-in interface 516 that is configured to engage the antenna housing 504 with a corresponding port in the base 502 and thus electrically couple the antenna housing 504 with the antenna system 400. In an aspect, the plug-in interface 516 has a lock/release component which allows the antenna housing 504 to be selectively removable from the base 502. This allows different types of antenna housings 504 to be added to and/or removed from the base 502. As shown in FIG. 8A, the antenna housing 504 includes an inner support member 510 that is electrically coupled to the plug-in interface 516 and supports the antenna module(s) 512.

In addition, the antenna housing 504 includes one or more 60-240 GHz millimeter wave antenna modules 512 within, wherein the antenna modules 512 are operatively coupled to the antenna system 400 when the antenna housing 504 is connected to the base 502. As shown in FIG. 8A, the example antenna housing 504 includes eight antenna modules 512 (e.g. 4 transmitter antenna modules and 4 receiver antenna modules) that are in a vertically stacked configuration, although a greater number or lesser number of antenna modules 512 can be used based on the frequency (60-240 GHz). For example, an antenna housing 504 may be configured to include only one antenna module 512 therein.

In an example aspect, one or more antenna modules may have the following parameters: 240 GHz; 128 Sectors; Sector angle=2.8°; Azimuth beamwidth=2.8°; Elevation beamwidth=12°; 4 sectors/plug-in module; 32 modules/pedestal; Bandwidth/sector=25 Gb/s FDX; Bandwidth/module=100 Gb/s FDX; and Bandwidth/pedestal=3.2 Tb/S FDX. It should be noted that these numbers are only exemplary and will change based on a change in parameters.

Figure 8C:
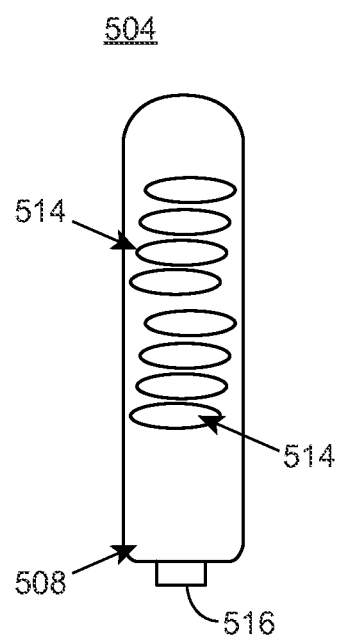
Figure 8B:
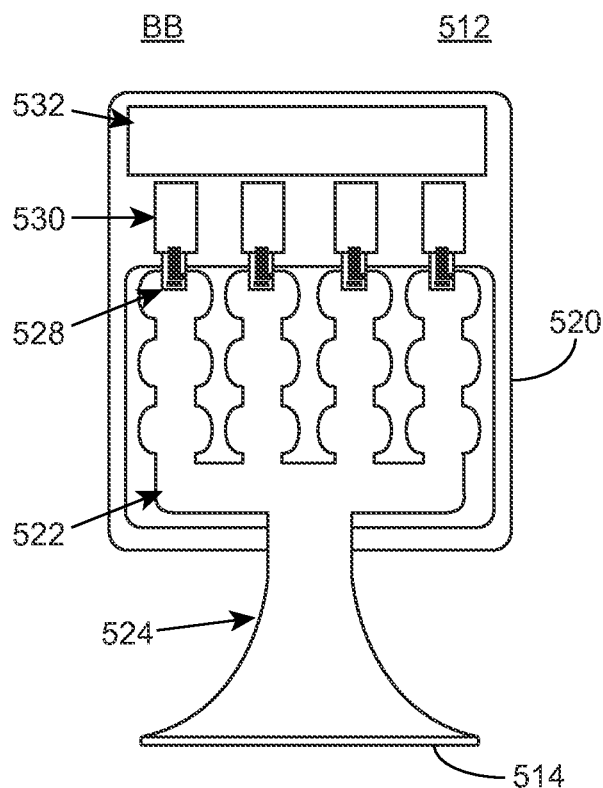

FIG. 8B illustrates a cross sectional view of one of the antenna modules shown in FIG. 8A in accordance with an aspect of the present disclosure. As shown in FIG. 8B, the antenna module 512 includes a body 520, a waveguide interface 522 within the body 520, a flanged horn antenna 524 in communication with the waveguide interface 522. It should be noted that the inner configuration of the antenna housing 504 shown in FIG. 8B is exemplary and that it is contemplated that the configuration of the antenna modules 512 may be different to include additional, fewer and/or different components.

In an aspect, the waveguide interface 522 includes an integrated chip and launch transducer package (LTP) that includes one or more waveguide transmitter and/or receiver launch transducers 528 and one or more communications devices 530, although additional/different components are contemplated. Although the shown package 100 has four launch transducers 528, the package may have a greater or lesser number of transmitter and/or receiver launch transducers. Thus, it is contemplated that the package 100 may include any number and combination of transmitter and/or receiver launch transducers.

In an aspect, the LTP is designed to be oriented as a substantially flat package and is configured to be easily mounted to a printed circuit board 532 coupled to the launch transducers 528 and communication devices 530. In an aspect, the launch transducers 528 have a single or multi-element radiating feed configuration in which the launch transducers which converge together via their feed lines at a common feed point.

In an aspect, the communication device 530 controls the magnitude and phase parameters of the one or more transmitting/receiving antennas 528. In an aspect, the communication device 108 comprises a silicon germanium (SiGe) chip, although gallium arsenide (GaAs), complimentary metal oxide semiconductor (CMOS), and/or other semiconductor chip is contemplated.

The waveguide interface 522 provides a common coupling mechanism between the communication devices 530 and the launch transducers 528 as well as the common flanged horn 524. Each communication device 530 is set to a unique radio frequency channel such that a plurality of transmitter or receiver channels operate simultaneously without causing interference or performance degradation between other adjacent communication devices within the same antenna module 512. The waveguide interface 522 is made up of a plurality of tuned radio frequency filters that pass only the corresponding radio frequency channel energy of the associated communications device 530 and rejects any adjacent communications devices radio frequency channel energy within the same antenna module 512.

The configuration of the launch transducers 528 along with the waveguide interface 522 supports multiple radio frequency channel transmission and reception through the waveguide interface 522 and out the opening aperture 514 of the antenna flange 524. Extremely high bandwidth is possible at millimeter wavelengths due to the high carrier frequency (60, 120 or 240 GHz) enabling wide channel bandwidths and advanced modulation techniques. In an aspect, spectral efficiencies on the order of ½ to 6 bits/sec/Hz are employed by the system but other spectral efficiencies using higher modulation indexes are anticipated as well as MIMO processing among the radio frequency channels within an antenna module 512, among separate antenna modules within an antenna housing 504, and among separate antenna housings 504. Further MIMO processing and spatial diversity is also anticipated through the use of polarization diversity through construction variations of the antenna module 512 that would support various polarization angles. General and specific details of the operational aspects of the antenna module 512 are described in more detail in U.S. patent application Ser. No. 13/383,203, filed Jan. 9, 2012 and entitled, "Precision Waveguide Interface," which is hereby incorporated by reference.

The flange antenna 524 is in communication with the waveguide interface 522 and has a configuration which allows the millimeter wave generated radiation which propagates through the waveguide interface 522 and out into the environment via the flange antenna aperture 514. In one aspect, the configuration of the flange antenna 524 as well as the antenna aperture 514 has an elliptical cross-section. It should be noted that the flange antenna 524 and antenna aperture 514 may have alternative cross-sectional shapes (e.g. square, rectangular).

In an aspect, the antenna flange 524 is configured to output the radiation energy in the form of a directional beamwidth. The elliptical configuration allows the antenna flange 524 aperture to achieve a controlled smaller azimuth and elevation beamwidth, thereby increasing radiated power in a given direction. The azimuth radiation angle can range between, and including, 2-12 degrees. The anticipated elevation radiation angle can range between and including 10-30 degrees depending upon operating frequency as well as aperture shape and dimension.

FIG. 8C illustrates a front view of antenna housing in accordance with an aspect of the present disclosure. As shown in the aspect in FIG. 8C, the antenna modules 512 are slightly offset in the azimuth axis to provide full coverage of the antenna modules' 512 azimuth angle (for 16 plug-in modules=22.5°, for 32 plug-in modules=11.25°. In a pedestal with all positions occupied by plug-in modules, the objective is to provide continuous spatial coverage of the 360° view of the pedestal. In an aspect, the stacked antenna modules 512 are oriented in a way such that the corresponding opening antenna apertures 514 of the modules 512 are horizontally staggered with respect to one another, as shown in FIG. 8C. In an aspect, the antenna modules 512 are located vertically above one another, whereby the antenna modules 512 are slightly pivoted about a common vertical axis. In another aspect, the antenna modules 512 are oriented vertically above one another, whereby the antenna modules 512 are horizontally staggered with respect to one another. In an aspect, one or more of the apertures have a cross-sectional dimension of 25 mm (1"), wherein the antenna housings 504 can provide more than 18 dB of gain and a beam pattern directivity of less than 25°.

In one aspect, a wireless approach to the data center must take into consideration the extremely high capacities and low latencies desired for communications between antenna systems 400. Using the 802.11ad standard channels and modulation parameters as a model, a single 60-240 GHz channel can support multi-Gb/s data rates. As an example, one of the modulation coding scheme (MCS) settings in the standard, MCS 9, uses QPSK modulation and can achieve 2.5 Gb/s in a single wireless channel. In the example, using the 802.11ad channel set with the MCS 9 at 2.5 Gb/s per channel, the antenna system 400 can reach a peak capacity of 4×16×2.5 Gb/s=160 Gb/s.

In an aspect, the handler module 414 is configured to select one or more directional and/or bearing antenna housing sectors to transmit and/or receive data wirelessly using millimeter wave frequencies. In one example aspect, the handler module 414 utilizes a 4 to 8-bit code for sector selection (direction or bearing). In the situation where an obstruction is located between any two antenna pedestals 500, the handling module 414 in one or more antenna systems 400 provides direct, cut-through routing enabling a multiple hop path (clearing the obstruction) between the source and destination nodes (as shown in FIG. 6B). These paths would be autonomously learned and controlled in each antenna system 400 through a heuristic process during network initialization and during operation. Both multiple-hop routes and multiple-direct routes will be available to any given pedestal 400 simply due to the fact that there are so many antenna ports within view of a given pedestal location. In traditional switching architectures, two or more uplink ports to the next tier of switching are often used to provide resilience (fault tolerance) in case of a port or cable failure. In the dense mesh topology, with many wireless ports available for connectivity, the level of resilience far exceeds a cabled system.

The antenna systems 400 in the mesh network are able utilize several radio channels to provide very high aggregate data handling capacities. Accordingly, one or more of the antenna systems 400 are configured to determine the capacity of the radio channels. The latency incurred by the wireless approach is the sum of the radio latency at each end of a link (pedestal-to-pedestal paths) and the propagation delay. It should be noted that the typical propagation delay of fiber or copper systems is slower than the speed of light due to the refractive index of the fiber media and capacitive/inductive properties of the copper media. Multimode fiber has a refractive index of 1.52, which translates to a propagation velocity factor of about 67% the speed of light. Even though propagation times are less than the switch latency, they need to be added to the total latency calculation for an accurate comparison. The fat tree example described above will be used as the cabled switch model.

In one example, switch latencies for the fastest switch technology available today cabled with an average run length of 25 meters (typical cable paths require circuitous routing which increases the length compared to the shortest geometrical distance between nodes). The calculated total latency is the sum of a TOR 400-to-TOR 400 path: 126+500+126+500+126+500+126=2004 ns.

Layer-1 wireless latency is dominated mainly by the forward error correction coding process that is used to mitigate bit errors from noise in the radio channel. In the case of the 802.11ad standard, LDPC (low-density parity-check) coding is used at various code rates depending upon the MCS chosen. A good comparison can be made with 10 GigE LDPC coding since the data rates are of the same order of magnitude, and the current IP cores available for both FPGA and ASIC implementation would be close in processing performance for the wireless requirement. There is a tradeoff in power consumed versus the coding/decoding time required. The decoding half of the system comprises the majority of the latency, and for reasonable power consumption the decoding latency is 320 ns, with a corresponding encoding latency of 30 ns. The radio path used in the modeling is set at an average transmission range of 35 m (approximately ½ the estimated maximum range of 70 m). The propagation delay for light (radio waves) is 3.3 ns/m; for 35 meters the delay is 3.3×35=117 ns. The total wireless latency between antenna systems 400 for a 35 meter path would be 30+117+320=467 ns. It should be noted that this value is less than the 25% of the estimated fastest switching latency for the fat tree system example.

The bisection bandwidth for an existing fat tree network is generally 103.68 Tb/s. In order to determine the capacity of the radio network, metrics are developed for a direct comparison using the same number of hosts or nodes in the network. For example, the pedestal antenna 500 can be configured to have 16 antenna housings 504, with each antenna housing 504 configured to have a 4-channel 60 GHz transceiver. The capacity of a radio channel is ultimately set by the Shannon limit and is measured in b/s. The Shannon-Hartley theorem sets the upper bound for channel capacity in equation (1).

$$C = B * \log 2*(1+10CN/10) \qquad (1)$$

Where
C capacity in b/s
B channel bandwidth in Hz
C/N carrier to noise ratio in dB For the radio channel under consideration (from IEEE 802.11ad), the channel bandwidth is 1.88 GHz. The practical minimum carrier to noise ratio assumed is about 13 dB. This sets the Shannon limit at 8.25Gb/s for the channel. The modulation and coding efficiency may reduce the practical bit rate. For QPSK (MCS 9) the modulation efficiency is 0.38; the LDPC code rate is 672,546 which sets the coding efficiency at 0.8125. 8.25 Gb/s×0.38×0.8125=2.55 Gb/s, which closely agrees with the MCS 9 bit rate of 2.5 Gb/s.

In a wireless mesh network where it is possible for multiple antenna nodes to contend for the same channel resources, the packet success probability is based on the number of potential interferes. The number of interferes is based on several variables and can be calculated from equation (2).

$$NI = \pi*[R*10(CN/10*\exp)]*Dr*A \qquad (2)$$

Where
NI number of interferes
R transmission radius in meters
C/N carrier to noise ratio in dB
exp loss exponent (set to 2.0)
Dr radio density in radios/m2
A antenna directivity in % (for the 16 sector array=6.25%)

Using the C/N ratio of 13 dB, the minimum received signal level that is required is approximately −60 dBm (the standard shows a minimum sensitivity for MCS 9 at −59 dBm). This is set by the current SiGe technology with a receiver noise figure at 6-8 dB, a channel bandwidth of 1.88 GHz, and assumed implementation losses. The maximum range is then set by knowing the transmit power and the antenna directivity gains for the transmitter and receiver (in the case of the 16 sector antenna each antenna will have a gain of approximately 18 dBi). The maximum range with these parameters at 60 GHz comes out to about 70 meters. The average range for the system in the data center will be assumed to be half this value at 35 meters.

Radio density may be an important factor to consider in a mesh network. Since the antenna pedestal 500 is positioned at the top of each rack 600, it will be equivalent to the rack density in the data center, which is about 0.5 racks/m2. Setting the transmission radius, R, in equation (2) at 35 m, C/N at 13 dB, exp to 2.0, Dr at 0.5/m2, and A at 6.25%, the number of interferes, NI, comes out to 15.3. Note that that the transmitter output power is assumed to be under software control such that the C/N ratio of 13 dB is maintained for the link at different transmission ranges.

Once the number of interferes for the network is determined, the next metric to calculate is the packet success rate (Pss) which directly affects the capacity. The packet success rate is a function of the number of interferes, the average transmission duty factor, and the number of radio channels implemented. The packet success rate is found from equation (3).

$$Pss = e[(-2*NI*TD)/M] \quad (3)$$

Where
Pss packet success rate in %
e natural log base
NI number of interferes
TD transmission duty factor in %
M number of radio channels The transmission duty factor is based on data center server/node traffic statistics and is shown to be below 1% on average. The number of radio channels for this analysis will be set at 3 which is consistent with the current FCC rules for the U.S. Setting NI to 15.3 (for 35 meter transmission radius), TD to 1% and M at 3, the Pss comes out to 90.27%.

The capacity for a single radio channel is then calculated as the product of the net channel capacity (2.55 Gb/s) and the packet success rate, Pss. For the 35 meter range, with Pss=90.27%, the system radio channel capacity is 2.55 Gb/s× 90.27%=2.30 Gb/s. Since the packet success rate changes as a function of transmission radius, the radio channel capacity will also change.

The capacity of the full pedestal 500 is the product of the number of radio channels per pedestal 500 (e.g. 3×16=48) and the single channel capacity. Using the results from above, the single channel capacity (R=35 m, TD=1%) is 2.30 Gb/s. and 48×2.30 Gb/s=110.4 Gb/s per pedestal. The system capacity can now be calculated for all the pedestals in a given transmission area determined by the transmission radius and radio density from equation (4).

$$SC = Npt*(\pi*R2*Dr) \quad (4)$$

Where
SC system capacity in bps
Npt pedestal capacity in bps
R transmission radius in meters
Dr radio (rack/pedestal) density in radios/m2

For a 35 m transmission radius, with the pedestal capacity at 110 Gb/s and the rack density at 0.5 racks/m2, the system capacity, SC comes out to 212 Tb/s. This is simply the aggregated capacity of all the pedestals within an area defined by a 35 meter radius.

In a wireless mesh network, a useful metric is to determine the communications capacity as a function of a normalized area. The IEEE uses the hectare (ha), or 10,000 m2 as the unit of measure for capacity area. Using the rack (pedestal) density of 0.5 racks/m2, and setting the transmission radius, R, to 35 meters, the area capacity of the wireless mesh comes out to 552 Tb/s/ha.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A wireless backplane network comprising:
a first antenna system partially located in a first network device cabinet including at least one first network device;
a first millimeter wave antenna of the first antenna system located external to the first device cabinet and configured to communicate with the first network device, the first millimeter wave antenna configured to wirelessly transmit a data message from the first network device over a high speed wireless backplane using emitted millimeter wave electromagnetic radiation;
a second antenna system partially located in a second network device cabinet including at least one second network device, wherein the first and second device cabinets are positioned spatially apart from one another; and
a second millimeter wave antenna of the antenna system coupled to the second antenna system and located external to the second device cabinet, the second millimeter wave antenna configured to wirelessly receive the data message over the high speed wireless backplane using millimeter wave electromagnetic radiation emitted from the first millimeter wave antenna, wherein the received data message is handled by the second network device.

2. The network of claim 1, wherein the first millimeter wave antenna further comprises a first antenna pedestal including:
a base; and
at least one antenna housing coupled to the base, the at least one antenna housing having one or more waveguide antennas therein, the one or more waveguide antennas radially positioned about the at least one antenna housing.

3. The network of claim 2, wherein the at least one antenna housing is removably coupled to the base.

4. The network of claim 2, wherein the one or more waveguide antennas further comprise:
a flange shaped antenna having an antenna aperture facing a distal end of the antenna housing;
a communication device;
a launch transducer coupled to the communication device, wherein the launch transducer emits millimeter wave electromagnetic energy configured to propagate out the antenna aperture as millimeter wave radiation.

5. The network of claim 2, wherein the antenna housing includes a plurality of waveguide antennas, at least one of the waveguide antennas configured to transmit data.

6. The network of claim 2, wherein the antenna housing includes a plurality of waveguide antennas, at least one of the waveguide antennas configured to receive data.

7. The network of claim 1, wherein the first antenna system further comprises a processor configured to operate an executable data handler stored in a memory, wherein the processor, when executing the executable data handler, causes the processor to select a transmission path for the data message to the second antenna system.

8. The network of claim 7, wherein the transmission path further comprises at least one intermediate antenna system.

9. The network of claim 1 wherein the first and second antenna systems wirelessly communicate without using a central switch.

10. The network of claim 1 wherein the first and second antenna systems communicate using time division multiplexing access and frequency division multiplexing access.

11. A method for wirelessly communicating in a backplane network, the method comprising:

handling, at a first antenna system partially located in a first network device cabinet, a data message received from a first network device of the first network device cabinet via a first network interface;

wirelessly transmitting the data message from a first millimeter wave antenna that is coupled to the first antenna system, the first millimeter wave antenna configured to wirelessly transmit the data message over a high speed wireless backplane network to a second network device in a second device cabinet using emitted millimeter wave electromagnetic radiation;

wirelessly receiving the data message at a second millimeter wave antenna of the second device cabinet, the second millimeter wave antenna configured to wirelessly receive the data message over the high speed wireless backplane network using emitted millimeter wave electromagnetic radiation, wherein the received data message is handled by a second antenna system coupled to the second millimeter wave antenna; and sending, via a second network interface, the received data message from the second antenna system to the second network device.

12. The method of claim 11, wherein the first millimeter wave antenna further comprises a first antenna pedestal including:
a base; and
at least one antenna housing coupled to the base, the at least one antenna housing having one or more waveguide antennas therein, the one or more waveguide antennas radially positioned about the at least one antenna housing.

13. The method of claim 12, wherein the at least one antenna housing is removably coupled to the base.

14. The method of claim 12, wherein the one or more waveguide antennas further comprise:
a flange shaped antenna having an antenna aperture facing a distal end of the antenna housing;
a communication device;
a launch transducer coupled to the communication device, wherein the launch transducer emits millimeter wave electromagnetic energy configured to propagate out the antenna aperture as millimeter wave radiation.

15. The method of claim 12, wherein the antenna housing includes a plurality of waveguide antennas, at least one of the waveguide antennas configured to transmit data.

16. The method of claim 12, wherein the antenna housing includes a plurality of waveguide antennas, at least one of the waveguide antennas configured to receive data.

17. The method of claim 12, wherein the first antenna system further comprises a processor configured to operate an executable data handler stored in a memory, wherein the processor, when executing the executable data handler, causes the processor to select a transmission path for the data message to the second antenna system.

18. The method of claim 17, wherein the transmission path further comprises at least one intermediate antenna system.

19. The method of claim 11, wherein the first and second antenna systems wirelessly communicate without using a central switch.

20. The method of claim 11, wherein the first and second antenna systems communicate using time division multiplexing access and frequency division multiplexing access.

* * * * *